(12) United States Patent
Prakash

(10) Patent No.: US 11,501,837 B1
(45) Date of Patent: Nov. 15, 2022

(54) READ OPERATION OR WORD LINE VOLTAGE REFRESH OPERATION IN MEMORY DEVICE WITH REDUCED PEAK CURRENT

(71) Applicant: SanDisk Technologies LLC, Addison, TX (US)

(72) Inventor: Abhijith Prakash, Milpitas, CA (US)

(73) Assignee: SanDisk Technologies LLC, Addison, TX (US)

(*) Notice: Subject to any disclaimer, the term of this patent is extended or adjusted under 35 U.S.C. 154(b) by 0 days.

(21) Appl. No.: 17/318,529

(22) Filed: May 12, 2021

(51) Int. Cl.
| | |
|---|---|
| G11C 11/00 | (2006.01) |
| G11C 16/30 | (2006.01) |
| G11C 11/56 | (2006.01) |
| G11C 16/08 | (2006.01) |
| G11C 16/26 | (2006.01) |
| G11C 16/04 | (2006.01) |
| H01L 27/11582 | (2017.01) |
| H01L 27/11556 | (2017.01) |

(52) U.S. Cl.
CPC .......... *G11C 16/30* (2013.01); *G11C 11/5642* (2013.01); *G11C 11/5671* (2013.01); *G11C 16/0483* (2013.01); *G11C 16/08* (2013.01); *G11C 16/26* (2013.01); *H01L 27/11556* (2013.01); *H01L 27/11582* (2013.01)

(58) Field of Classification Search
CPC ..... G11C 16/30; G11C 11/5642; G11C 16/08; G11C 16/26
See application file for complete search history.

(56) References Cited

U.S. PATENT DOCUMENTS

| | | | | |
|---|---|---|---|---|
| 6,122,214 A | * | 9/2000 | Fujimoto | G11C 11/406 365/222 |
| 7,301,830 B2 | * | 11/2007 | Takahashi | G11C 11/4074 365/189.11 |
| 7,656,720 B2 | * | 2/2010 | Ito | G11C 11/4074 365/185.27 |
| 8,923,088 B2 | | 12/2014 | Chen et al. | |
| 10,026,486 B1 | * | 7/2018 | Dutta | G11C 16/3459 |
| 10,365,841 B2 | | 7/2019 | Elhamias et al. | |
| 10,636,500 B1 | | 4/2020 | Chen et al. | |
| 10,861,537 B1 | | 12/2020 | Lien et al. | |

OTHER PUBLICATIONS

U.S. Appl. No. 16/790,306, filed Feb. 13, 2020.
U.S. Appl. No. 16/790,362, filed Feb. 13, 2020.
U.S. Appl. No. 16/704,817, filed Dec. 5, 2019.

* cited by examiner

*Primary Examiner* — Pho M Luu
(74) *Attorney, Agent, or Firm* — Vierra Magen Marcus LLP

(57) ABSTRACT

A reducing peak current consumption in a memory device when performing a word line voltage refresh operation or a read operation. When a word line voltage refresh operation or read operation is performed for the first time after a memory device powers up, the operation is performed with a power-saving technique such as reducing a ramp up rate of a voltage pulse, ramping up the voltage pulse in multiple steps, initiating the ramp up for different groups of word lines in a block at different times, initiating the ramp up for different blocks of word lines at different times, and reducing the number of blocks which are refreshed concurrently. When an additional word line voltage refresh operation or read operation is subsequently performed, the power-saving technique can be omitted.

20 Claims, 20 Drawing Sheets

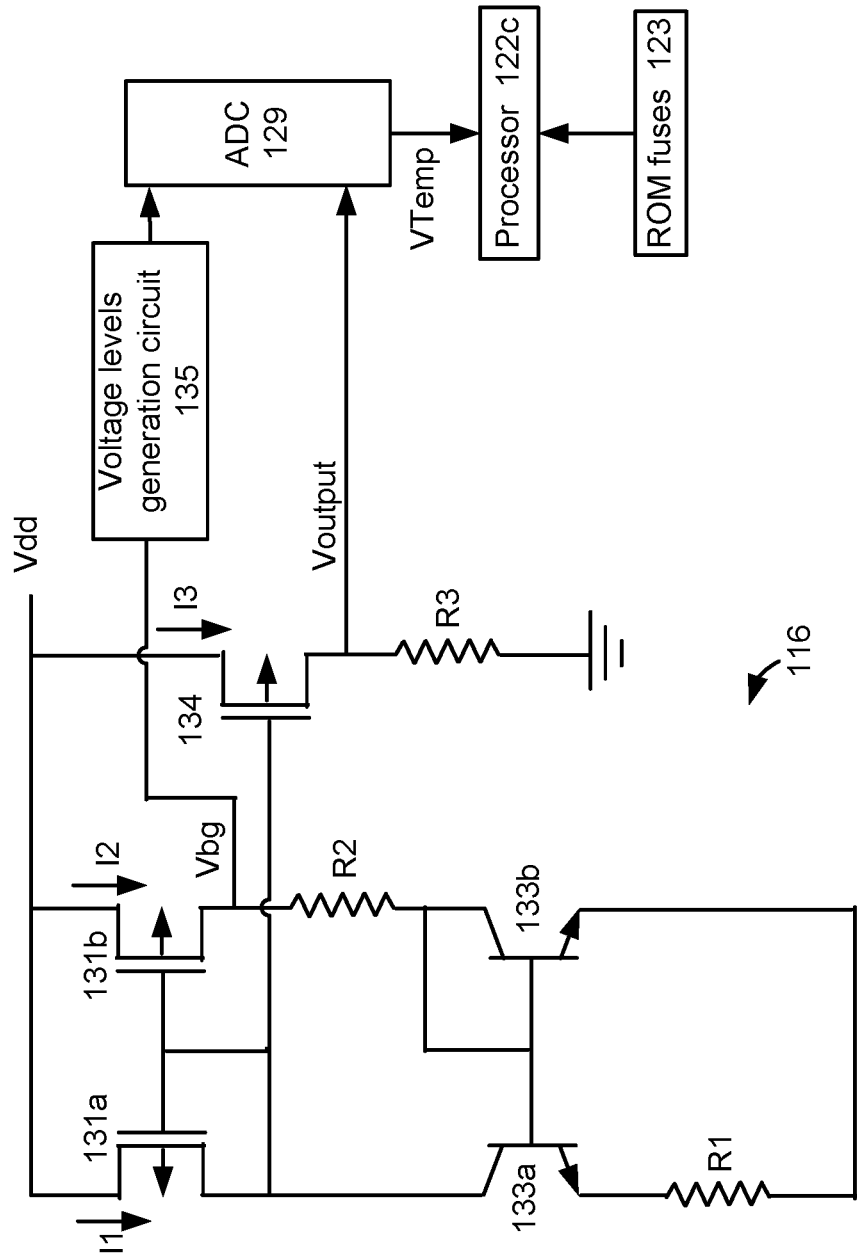

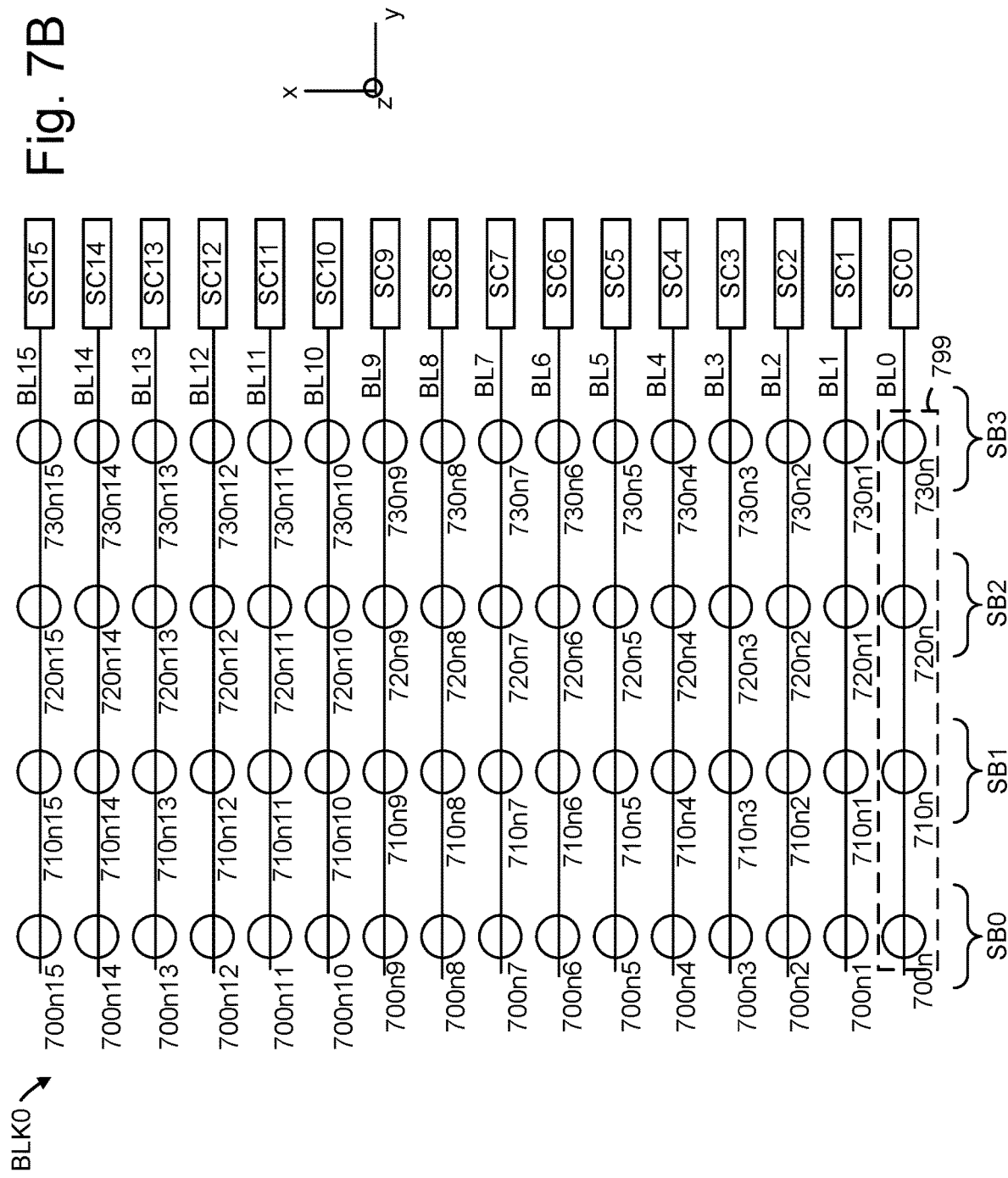

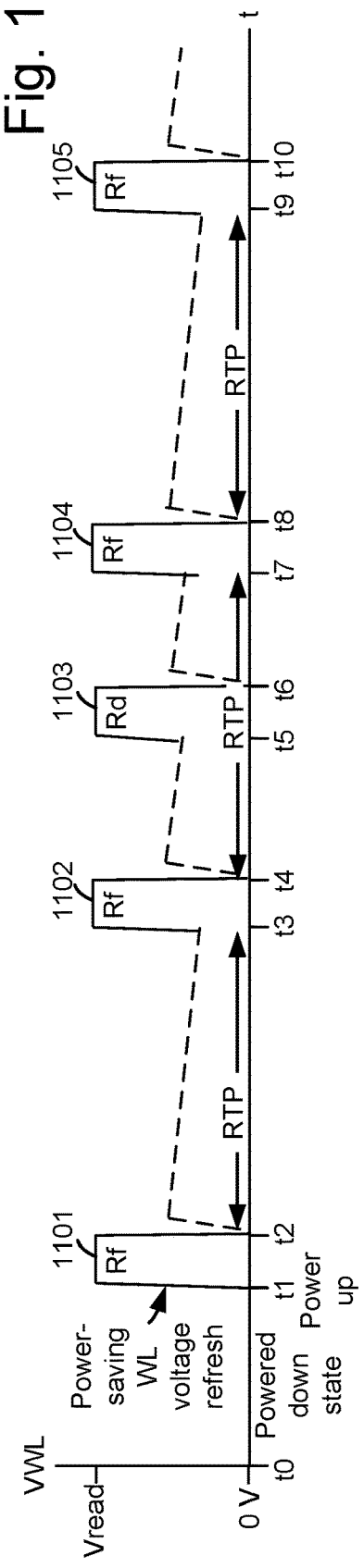
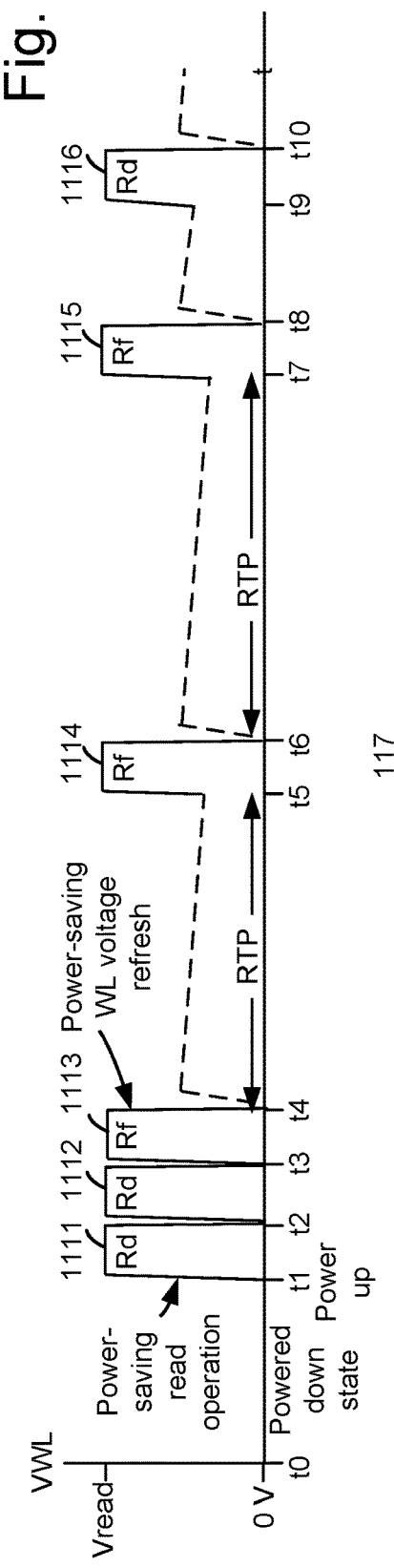
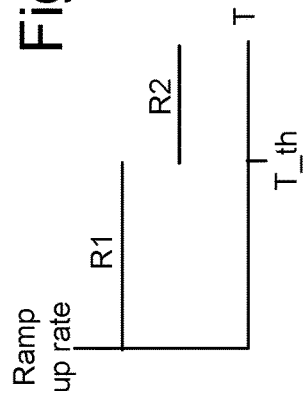

READ OPERATION OR WORD LINE VOLTAGE REFRESH OPERATION IN MEMORY DEVICE WITH REDUCED PEAK CURRENT

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 1C depicts an example of the temperature-sensing circuit 116 of FIG. 1A.

FIG. 7B depicts an example top view of the block BLK0 of FIG. 7A, with respective NAND strings, bit lines and sense circuits.

FIG. 11A depicts an example plot of word line voltage versus time, consistent with the process of FIG. 10A, step 1004.

FIG. 11B depicts an example plot of word line voltage versus time, consistent with the process of FIG. 10A, steps 1002 and 1004.

FIG. 12 depicts an example of the block program status table 117 of FIG. 1A for use with the process of FIG. 10A, step 1002e.

FIG. 13 depicts an example plot of ramp up rate versus temperature (T) for use with the process of FIG. 10A, step 1002f.

DETAILED DESCRIPTION

Figure 1A:
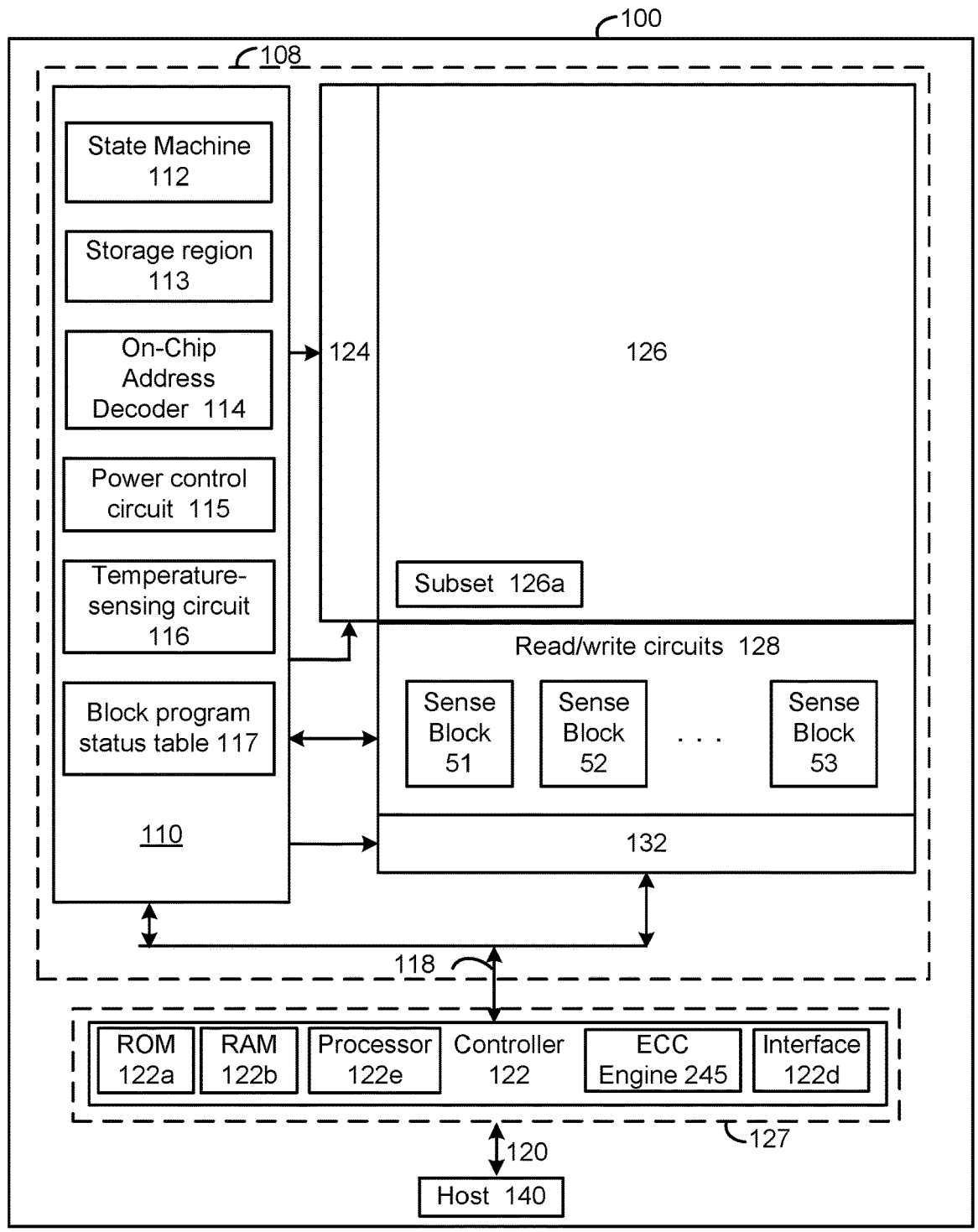
FIG. 1A is a block diagram of an example memory device.

Apparatuses and techniques are described for performing a read operation or a word line voltage refresh operation in memory device with a reduced peak current.

In a memory device, memory cells can be connected in series, such as in a NAND string, and arranged in a block. Further, the memory cells can be arranged in a 2D or 3D structure. In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells. In a 2D memory structure, the memory cells may be arranged in horizontal NAND strings on a substrate. The memory cells in a block can be subject to program, read and erase operations.

Each memory cell may be associated with a data state according to write data in a program command. Based on its data state, a memory cell will either remain in the erased state or be programmed to a programmed data state. For example, in a one bit per cell block, there are two data states including the erased state and the programmed state. In a two-bit per cell block, there are four data states including the erased state and three higher data states referred to as the A, B and C data states. In a three-bit per cell block, there are eight data states including the erased state and seven higher data states referred to as the A, B, C, D, E, F and G data states. In a four-bit per cell block, there are sixteen data states including the erased state and fifteen higher data states. A block with a single bit per cell is referred to as a single-level cell (SLC) block while a block with multiple bits per cell is referred to as a multi-level cell (MLC) block.

After the memory cells are programmed, the data can be read back in a read operation. A read operation can involve applying a series of read voltages to a selected word line while sensing circuitry determines whether cells connected to the selected word line are in a conductive (turned on) or non-conductive (turned off) state. If a memory cell is in a non-conductive state, the Vth of the memory cell exceeds the read voltage. The read voltages are set at levels which are expected to be between the threshold voltages of adjacent data states. During the read operation, a read pass voltage (Vread) such as 8-9 V is applied to the unselected word lines to provide the associated memory cells in a strongly conductive state.

However, the Vth of the memory cells can vary based on changes in the word line voltage when the memory cells are idle, between program or read operations. In particular, word line voltages can be coupled up from the channels of the NAND strings. In one possible coupling up mechanism, a read pass voltage, Vread, is applied to unselected word lines during a sensing operation, such as a read operation or a verify test of a program operation, and subsequently ramped down to 0 V, for instance. The ramp down causes a down coupling in the channel voltage. The down coupling subsequently dissipates and the channel voltage increases to a nominal level, close to 0 V, while the word line voltage is floated. This results in a coupling up of the word line voltage to a positive voltage such as about 4-5 V. This positive word line voltage is desirable as it tends to keep the Vth of the memory cells at a stable level. Although, over time, such as several minutes, the word line voltage discharges, resulting in a shift in the Vth of the memory cells which can potentially result in read errors.

When the word line voltages of a block are discharged, the block is in a first read or cold read state. This can occur when a memory device is powered on, or when the coupled up word line voltage has discharged. When the word line voltages of a block are coupled up, the block is in a second read or warm read state. This can occur just after a sensing operation has been performed.

To maintain the word lines in the second read state, a word line voltage refresh operation can be performed periodically to maintain the positive word line voltage during the idle time. The word line voltage refresh operation or read operation can involve applying a refresh voltage signal or voltage pulse to the word lines and subsequently floating the word lines.

However, when a word line voltage refresh operation or read operation is performed initially after the memory device and its control circuits have powered up, peak current consumption (Icc) can exceed a specified maximum level. If the peak Icc specification is exceeded, the memory chip may be rendered useless due to a potential quenching of the power supply. Both average Icc and peak Icc have separate specifications to meet. The average Icc is related to the lifetime of a battery which powers the memory device.

When ramping up the word line voltages, the peak Icc spikes up. The peak Icc depends on the starting voltage on the word lines, at the start of the ramp. In the first read state, the word line voltage is initially at Vss, e.g., 0 V. In the second read state, the word line voltage is initially at a positive voltage such as about 4-5 V. To ramp up the voltage to desired refresh voltage, Vrefresh, in a given time period, the ramp up rate will be greater in the first read condition than in the second read condition, resulting in a higher peak Icc, since $Icc=C \times dV/dt$, where C is the capacitance of the word lines, dV is the change in voltage and t is the time period. This implies the lower the initial voltage, the higher the peak Icc. Vrefresh can be slightly lower than Vread, e.g., about 2 V lower, in one example. Vrefresh and Vread can be high enough to provide the memory cells in a conductive state.

The periodic word line voltage refresh operation is not performed when the memory device is powered down. As a result, at the time a memory device powers up from a powered down state, e.g., the off state or a sleep state, it is likely that the word lines have discharged to the first read state.

Techniques provided herein address the above and other issues. In one aspect, when a word line voltage refresh operation or read operation is performed for the first time after a memory device powers up, the operation is performed with a power-saving technique. For example, the ramp up rate can be decreased while an additional time period is allocated for the ramp up. In another aspect, a refresh voltage, Vrefresh, or a read pass voltage, Vread, is attained in multiple steps with the peak magnitude of the voltage pulse reduced for the first step or for first few steps. In another aspect, the ramp up is initiated for different groups of word lines in a block at different times. In another aspect, the ramp up is initiated for different blocks of word lines at different times. In another aspect, the ramp up rate is set based on a number of programmed blocks. In another aspect, the ramp up rate is reduced if a temperature is above a threshold. In another aspect, the voltage pulse is applied to a reduced number of blocks at a time. One or more of the aspects can be used together.

When an additional word line voltage refresh operation or read operation is subsequently performed, the power-saving technique can be omitted. This allows the peak Icc specification to be met while avoiding a time penalty.

These and other features are discussed further below.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically, a controller 122 is included in the same memory device 100 (e.g., a removable storage card) as the one or more memory die 108. The controller may be on a die 127 which is separate from the memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, a storage region 113, an on-chip address decoder 114, a power control circuit 115, a temperature-sensing circuit 116 and a block program status table 117.

In one embodiment, the state machine is programmable by operational parameters and software/code stored in the storage region 113. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control circuit 115 controls the power and voltages supplied to the word lines, select gate lines, bit lines and source lines during memory operations. It can include drivers for word lines, SGS and SGD transistors and source lines. See also FIG. 3A. The sense blocks can include bit line drivers, in one approach.

The temperature-sensing circuit 116 can sense a temperature of the memory device. See FIG. 1C for an example implementation of the temperature-sensing circuit. The circuits may include hardware, software and/or firmware for performing the processes described herein.

The block program status table 117 can store data indicating whether a block is programmed, e.g., comprises programmed memory cells of one or more word lines, or erased. See FIG. 12 for an example.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control circuit 115, temperature-sensing circuit 116, sense blocks 51, 52, . . . , 53, read/write circuits 128, controller 122, and so forth. The state machine is an electrical circuit that can control operations of the control circuitry 110. In some embodiments, the state machine is implemented by or replaced by a microprocessor, microcontroller and/or RISC processor.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. The RAM 122b can be a DRAM which stores non-committed data, for example.

During programming, a copy of the data to be programmed is stored in the RAM 122b until the programming is successfully completed. In response to the successful completion, the data is erased from the RAM 122b and is committed or released to the block of memory cells. The RAM 122b may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage signals including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable memory devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. For example, see FIG. 8. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 1B:
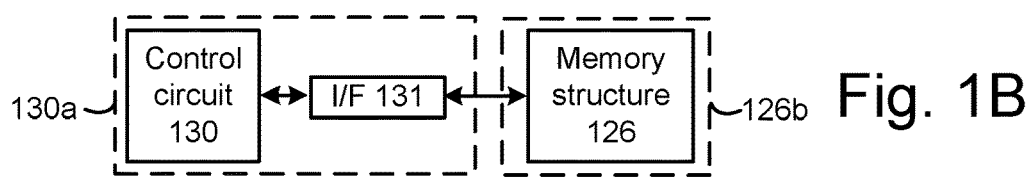
FIG. 1B is a block diagram of an arrangement of the memory device 100 of FIG. 1A in which a control circuit 130 on a first die 130a communicates with the memory structure 126 on a separate second die 126b.

FIG. 1B is a block diagram of an arrangement of the memory device 100 of FIG. 1A in which a control circuit 130 on a first die 130a communicates with the memory structure 126 on a separate second die 126b. The control circuit may communicate with the memory structure and the die 126b via a memory interface 131, for example, similar to the memory interface 122d. Examples of a memory interface (I/F) include the Common Flash Memory Interface of JEDEC. The techniques described herein can be implemented with a control die 130a bonded to one or more memory die 126b, where the memory die includes the memory structure 126 and the control die includes a control circuit 130 representing all, or subset, of the peripheral circuits of the memory structure. The control circuit can be on the same die as the plurality of memory cells, or on a different die than the plurality of memory cells.

For example, the memory structure may contain non-volatile memory cells. In some embodiments, the memory die and the control die are bonded together. The control circuit 130 can comprise a set of electrical circuits that perform memory operations (e.g., write, read, erase and others) on the memory structure. The control circuit can include the state machine 112, storage region 113, on-chip address decoder 114 and power control circuit 115. In another embodiment, one portion of the read/write circuits 128 are located on the control die 130a and another portion of the read/write circuits are located on memory die 126b. For example, the read/write circuits may contain sense amplifiers. The sense amplifiers can be located on the control die and/or the memory die.

In an example implementation, the control circuit 130 is configured to connect to a NAND string and a substrate, and the memory interface 131 is connected to the control circuit. The circuit can be configured to issue command via the memory interface to apply different voltage signals to bit lines, word lines, select gate lines, and a CELSRC line (source line), for example. For example, the control circuit can issue commands to the voltage drivers in FIG. 3A to provide the voltage signals described herein and to implement the techniques discussed herein.

The term "memory die" can refer to a semiconductor die that contains non-volatile memory cells for storage of data. The term, "control circuit die" can refer to a semiconductor die that contains control circuitry for performing memory operations on non-volatile memory cells on a memory die. Typically, numerous semiconductor die are formed from a single semiconductor wafer.

FIG. 1C depicts an example of the temperature-sensing circuit 116 of FIG. 1A. The circuit includes pMOSFETs 131a, 131b and 134, bipolar transistors 133a and 133b and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor 122e. This is data indicating a temperature of the memory device. ROM fuses 123 store data which correlates the matching voltage level to a temperature, in one approach. The processor then uses the temperature to set temperature-based parameters in the memory device such as by using the comparison circuit.

Vbg, is obtained by adding the base-emitter voltage (Vbe) across the transistor 131b and the voltage drop across the resistor R2. The bipolar transistor 133a has a larger area (by a factor N) than the transistor 133b. The PMOS transistors 131a and 131b are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131a and 131b and the current through the transistor 134 mirrors the current through the transistors 131a and 131b.

Figure 2:
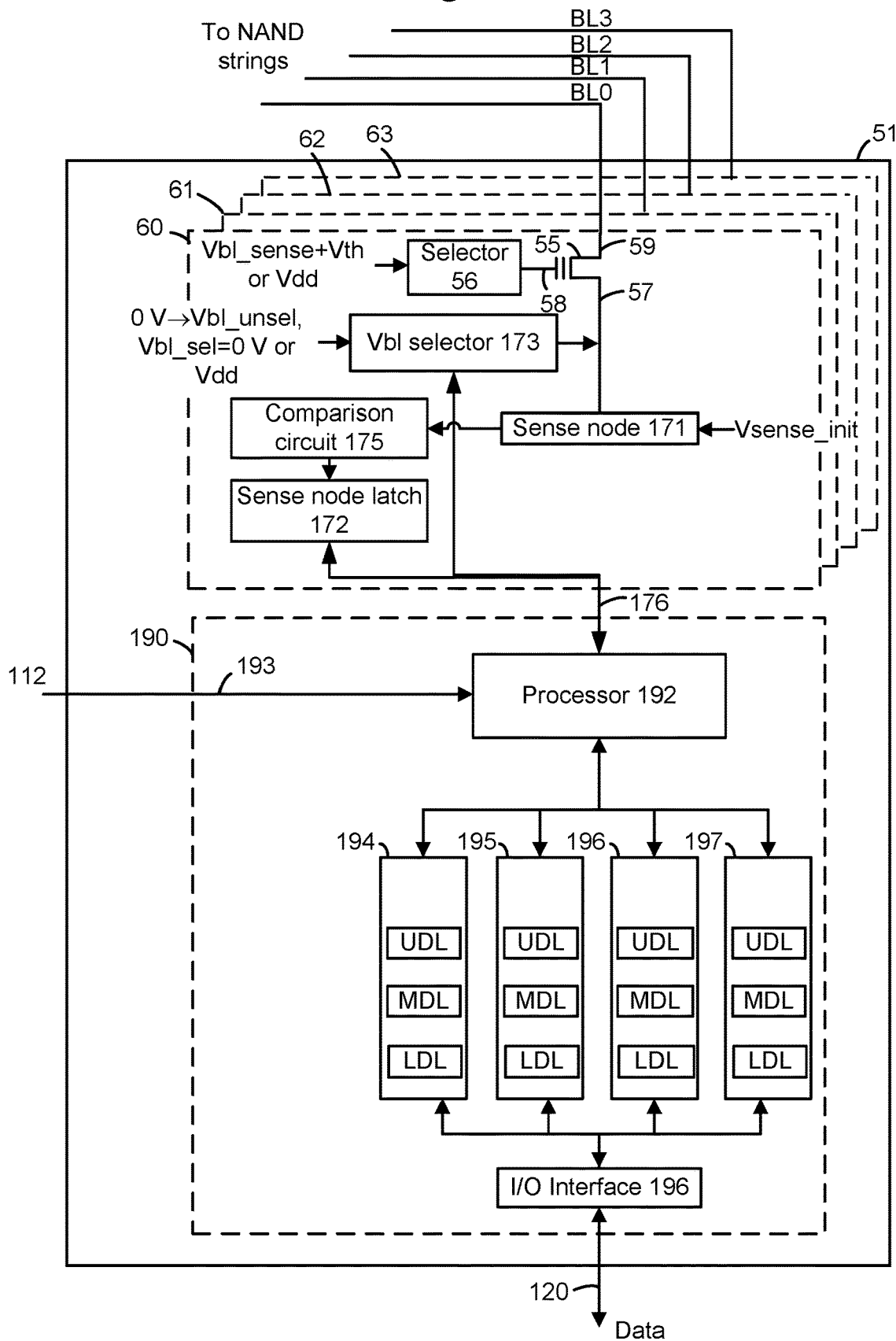
FIG. 2 is a block diagram depicting one embodiment of the sense block 51 of FIG. 1A.

FIG. 2 is a block diagram depicting one embodiment of the sense block 51 of FIG. 1A. An individual sense block 51 is partitioned into one or more core portions, referred to as sense circuits 60-63 or sense amplifiers, and a common portion, referred to as a managing circuit 190. In one embodiment, each sense circuit is connected to a respective bit line which in turn is connected to one or more NAND strings. For example, in a configuration consistent with FIGS. 7A and 7B, each bit line is connected to four NAND strings, with one NAND string per sub-block. A common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

The sense circuit 60, as an example, operates during a program loop to provide a pre-charge/program-inhibit voltage to an unselected bit line or a program-enable voltage to a selected bit line. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

The sense circuit 60 also operates during a verify test in a program loop to sense a memory cell to determine whether it has completed programming by reaching an assigned data state, e.g., as indicated by its Vth exceeding the verify voltage of the assigned data state. The sense circuit 60 also operates during a read operation to determine the data state to which a memory cell has been programmed. The sense circuit 60 also operates in an erase operation during a verify test to determine whether a plurality of memory cells have a Vth below a verify voltage. A verify test can be performed for the memory cells connected to all of the word lines in a block, or to memory cells connected to odd- or even-numbered word lines. The sense circuit performs sensing by determining whether a conduction current in a connected bit line is above or below a predetermined threshold level. This indicates whether the Vth of the memory cell is below or above, respectively, the word line voltage.

The sense circuit may include a selector 56 or switch connected to a transistor 55 (e.g., an nMOS). Based on voltages at the control gate 58 and drain 57 of the transistor 55, the transistor can operate as a pass gate or as a bit line clamp. When the voltage at the control gate is sufficiently higher than the voltage on the drain, the transistor operates as a pass gate to pass the voltage at the drain to the bit line (BL) at the source 59 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 56 may pass a power supply voltage Vdd, e.g., 3-4 V to the control gate of the transistor 55 to cause it to operate as a pass gate.

When the voltage at the control gate is lower than the voltage on the drain, the transistor 55 operates as a source-follower to set or clamp the bit line voltage at Vcg−Vth, where Vcg is the voltage on the control gate 58 and Vth, e.g., 0.7 V, is the threshold voltage of the transistor 55. This assumes the source line is at 0 V. If Vcelsrc is non-zero, the bit line voltage is clamped at Vcg−Vcelsrc−Vth. The transistor is therefore sometimes referred to as a bit line clamp (BLC) transistor, and the voltage Vcg on the control gate 58 is referred to as a bit line clamp voltage, Vblc. This mode can be used during sensing operations such as read and verify operations. The bit line voltage is thus set by the transistor 55 based on the voltage output by the selector 56. For example, the selector 56 may pass Vsense+Vth, e.g., 1.5 V, to the control gate of the transistor 55 to provide Vsense, e.g., 0.8 V, on the bit line. A Vbl selector 173 may pass a relatively high voltage such as Vdd to the drain 57, which is higher than the control gate voltage on the transistor 55, to provide the source-follower mode during sensing operations. Vbl refers to the bit line voltage.

The Vbl selector 173 can pass one of a number of voltage signals. For example, the Vbl selector can pass a program-inhibit voltage signal which increases from an initial voltage, e.g., 0 V, to a program inhibit voltage, e.g., Vbl_unsel for respective bit lines of unselected NAND string during a program loop. The Vbl selector 173 can pass a program-enable voltage signal such as 0 V for respective bit lines of selected NAND strings during a program loop. The Vbl selector may select a voltage signal from the BL voltage driver 340 in FIG. 3A based on commands from the processor 192, for example.

In one approach, the selector 56 of each sense circuit can be controlled separately from the selectors of other sense circuits. The Vbl selector 173 of each sense circuit can also be controlled separately from the Vbl selectors of other sense circuits.

During sensing, a sense node 171 is charged up to an initial voltage, Vsense_init, such as 3 V. The sense node is then passed to the bit line via the transistor 55, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state.

In particular, the comparison circuit 175 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 172 is set to 0 or 1, for example, by the comparison circuit 175 based on whether the memory cell is in a conductive or non-conductive state, respectively. For example, in a program-verify test, a 0 can denote fail and a 1 can denote pass. The bit in the sense node latch can be read out in a state bit scan operation of a scan operation, or flipped from 0 to 1 in a fill operation.

The bit in the sense node latch can also be used in a lockout scan to decide whether to set a bit line voltage to an inhibit or program level in a next program loop. The latches 194-197 may be considered to be data state latches or user data latches because they store the data to be programmed into the memory cells.

The managing circuit 190 comprises a processor 192, four example sets of data latches 194-197 for the sense circuits 60-63, respectively, and an I/O interface 196 coupled between the sets of data latches and the data bus 120. One set of three data latches, e.g., comprising individual latches LDL, MDL and UDL, can be provided for each sense circuit. In some cases, a different number of data latches may be used. In a three bit per cell embodiment, LDL stores a bit for a lower page of data, MDL stores a bit for a middle page of data and UDL stores a bit for an upper page of data.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120. During reprogramming, a respective set of data latches of a memory cell can store data indicating when to enable the memory cell for reprogramming based on the program pulse magnitude.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

Figure 3A:
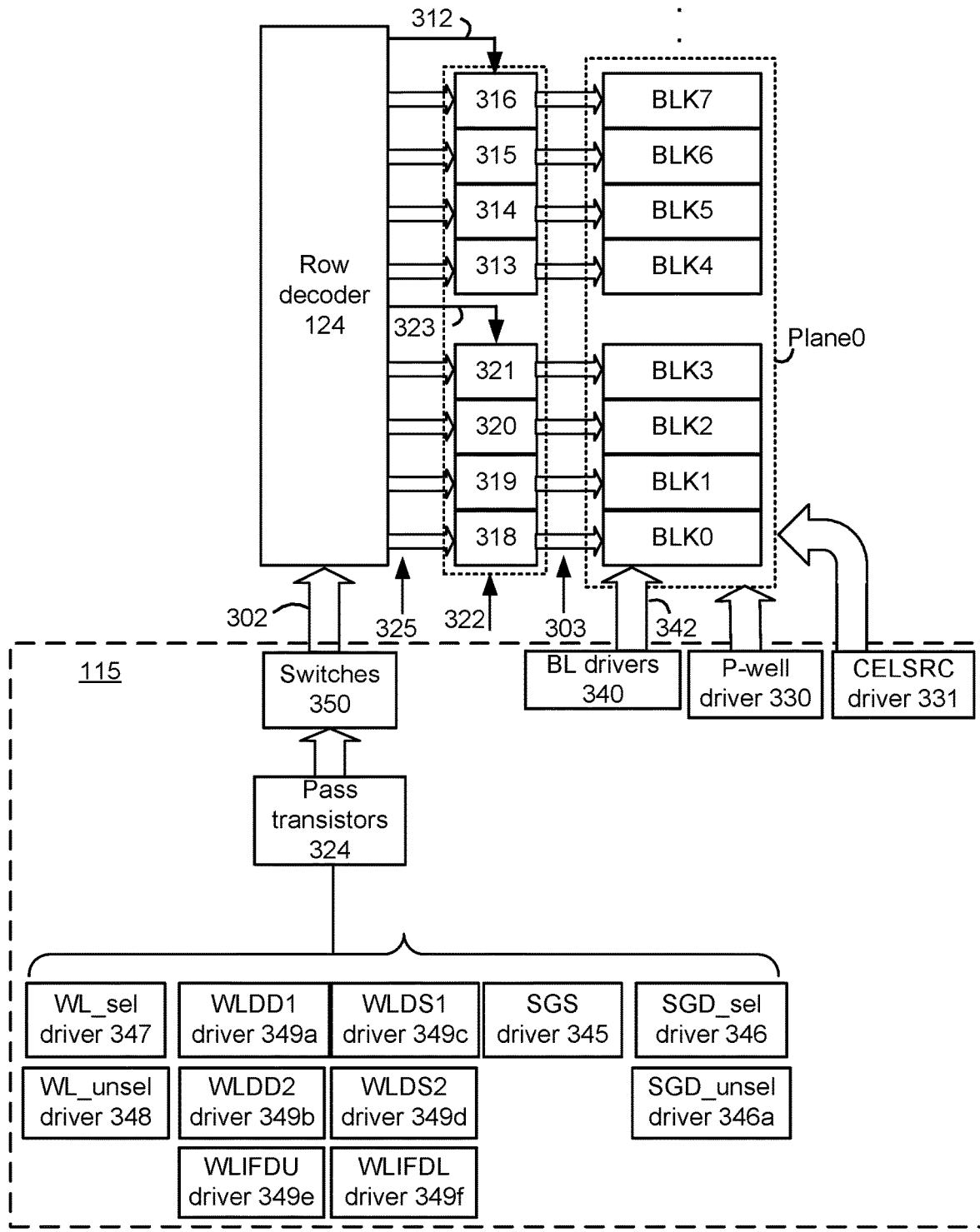
FIG. 3A depicts an example implementation of the power control circuit 115 of FIG. 1A for providing voltages to blocks of memory cells in a plane.

FIG. 3A depicts an example implementation of the power control circuit 115 of FIG. 1A for providing voltages to blocks of memory cells. The circuitry shown can be repeated for each plane of a die, in one approach. In this example, the memory structure 126 includes a set of eight blocks, BLK0-BLK7, in a plane, Plane0, consistent with FIG. 4. Generally, the blocks can be in one or more planes. The row decoder 124 of FIG. 1A provides voltages to word lines and select gate control lines of each block via a set of pass transistors 322. In one approach, a separate row decoder is provided for each block. For example, see RD0-RD7 in FIG. 3E. The row decoder can be provided one side of a block, and provides a control signal to pass transistors which connect the blocks to the row decoder. Further, the blocks can be arranged in groups, where the pass transistors of each set of blocks in a group are controlled by a common control gate voltage. See, e.g., FIG. 3E, where a first group (GRP0) includes BLK0-BLK3 and a second group (GRP1) includes BLK4-BLK7. Thus, the pass transistors for a set of blocks are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, in a first group, a control gate line 323 is connected to sets of pass transistors 318-321, which in turn are connected to control gate lines of BLK0-BLK3, respectively. In a second group, a control gate line 312 is connected to sets of pass transistors 313-316, which in turn are connected to control gate lines of BLK4-BLK7, respectively.

Typically, program or read operations are performed on one selected sub-block at a time in a block. An erase operation may be performed on a selected block or sub-block. The row decoder can connect global control lines 302 to post-switch, local control lines 303 via pre-switch control lines 325 and the set of pass transistors (switches) 322. The control lines represent conductive paths. Voltages can be provided on the global control lines from a one or more voltage drivers. Some of the voltage drivers may provide voltages to switches 350 which connect to the global control lines. Pass transistors 324 are controlled to pass voltages from the voltage drivers to the switches 350.

A number of voltage drivers can be provided that are connected to the pass transistors. For example, a selected data word line driver, WL_sel driver 347, provides a voltage signal on a data word line which is selected during a program or read operation.

The WL_unsel driver 348 provides a voltage signal on unselected data word lines. This voltage driver can be used to apply a voltage pulse to all word lines of one or more blocks in a word line voltage refresh operation, or to unselected word lines in a block in a read operation. Various characteristics of the voltage pulse can be modified as described herein to reduce peak Icc. See also FIG. 3B-3D. In one approach, a single WL_unsel driver can apply the voltage pulse to word lines of one or more blocks at a given time on a chip by controlling the row decoders to either pass or block the voltage pulse.

A number of drivers for dummy word lines can also be provided. For example, WLDD1, WLDD2, WLDS1, WLDS2, WLIFDU and WLIFDL drivers 349a-349f, respectively, provide a voltage signal on the first drain-side dummy word line WLDD1, the second drain-side dummy word line WLDD2, the first source-side dummy word line WLDS1, the second source-side dummy word line WLDS2, the upper interface dummy word line WLIFDU and the lower interface dummy word line WLIFDL, respectively. See FIGS. 6A and 6B. This is one example, as other examples are possible. In this example, there are two drain-side dummy word lines and two source-side dummy word lines, and two interface dummy word lines, where each dummy word line can receive an independent voltage signal. In another approach, multiple drain-side or source-side dummy word lines have their control gates connected so that they receive a common voltage signal.

The voltage drivers can also include an SGS driver 345 which is common to the different sub-blocks in a block, in one example. This driver provides a voltage signal to a control line connected to the control gates of the SGS transistors (source-side select gate transistors). In another option, a separate SGS driver is provided for each sub-block.

The voltage drivers can also include a SGD_sel driver 346 for the SGD transistors of a selected sub-block of a block involved in an operation, and a SGD_unsel driver 346a for the SGD transistors of unselected sub-blocks of the block. In another option, a separate SGD driver is provided for each sub-block. The SGD drivers provide a voltage to a control line connected to the control gates of an SGD transistor (drain-side select gate transistor).

The various components, including the row decoder, may receive commands from a controller such as the state machine 112 or the controller 122 to perform the functions described herein.

The p-well voltage driver 330 provides a voltage Vp-well to the p+ contact 612b in the p-well region 612, e.g., via the conductive path 682. See FIG. 5A. In one approach, the p-well region is common to a set of blocks. A set of bit lines 342 is also shared by the blocks. A source line voltage driver, referred to as a CELSRC driver 331, provides a voltage Vcelsrc to a source end of a NAND string. For example, Vcelsrc can be provided to the n+ contact 612c in the p-well region, e.g., via the local interconnect 651 in FIG. 6A.

Bit line (BL) voltage drivers 340 include voltage sources which provide voltages to the bit lines 342. The bit line voltage for sensing can be 0.5 V, for example.

Figure 3B:
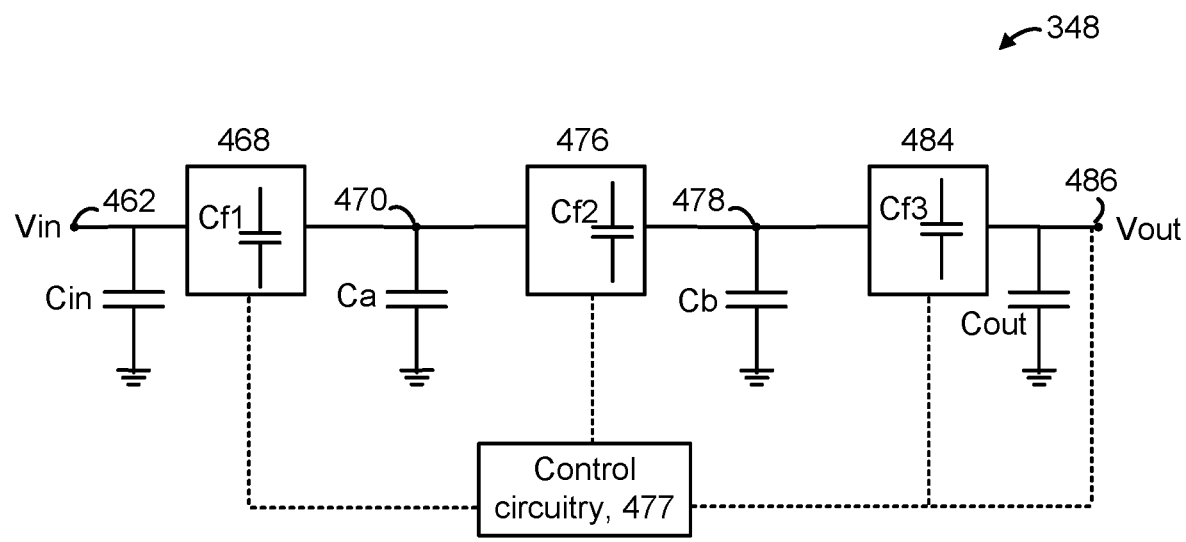
FIG. 3B depicts an example implementation of the WL_unsel driver 348 of FIG. 3A as a multi-stage charge pump.

FIG. 3B depicts an example implementation of the WL_unsel driver 348 of FIG. 3A as a multi-stage charge pump. A charge pump is an example of a voltage driver which can provide a higher output voltage than its input voltage. Vin is provided at input node 462 and Vout is obtained at an output node 486. For example, Vin may be a fixed power supply voltage sometimes referred to as Vdd in a semiconductor chip. Vout could be a word line voltage, for instance.

As an example, three stages 468, 476 and 484 are provided. Each stage 468, 476 and 484 can include switches and one or more flying capacitors Cf1, Cf2 and Cf3, respectively, such as a MOS (metal oxide semiconductor) capacitor. At the node 462, charge from the input voltage is maintained in an input capacitor Cin which is connected to a ground node. At a node 470 which is between the first stage 468 and the second stage 476, a capacitor Ca is connected to a ground node. At a node 478 which is between the second stage 476 and the third stage 484, a capacitor Cb is connected to a ground node. Finally, at the output node 486, an output capacitor Cout is connected to a ground node. A multi-stage charge pump can provide greater flexibility in terms of providing a high output voltage and a greater range of output voltages, compared to a single stage charge pump. Further, each stage can include one or more capacitors to provide even greater flexibility.

The multi-stage charge pump is operated by control circuitry 477 which controls switching in each stage. The switches may be MOSFETs, bipolar junction transistors or relay switches, for instance.

Based on the switching, charge is transferred from the input node 462 of the first stage to Cf1, and from Cf1 to the node 470. Charge is then transferred from the node 470 of the second stage to Cf2 in the second stage, and from Cf2 to the node 478. Charge is then transferred from the node 478 to Cf3 in the third stage, and from Cf3 to the output node 486.

Generally, each stage of the charge pump operation includes two main phases: charging the flying capacitor from the input node, and discharging the flying capacitor into the output node. During each phase, some switches are closed (conductive), connecting the flying capacitor to either the input node, the output node, or a ground node. The control circuitry 477 may communicate with the output node 486 as well such as to detect its level and to make adjustments in the charge pump. For example, a switching frequency can be reduced if Vout is above a target voltage, or increased if Vout is below the target voltage. As discussed further in connection with FIGS. 3C and 3D, Vout is proportional to the switching frequency.

Note that the circuits shown are examples only, as various modifications can be made. Other types of voltage driver circuits could be used as well.

Figure 3C:
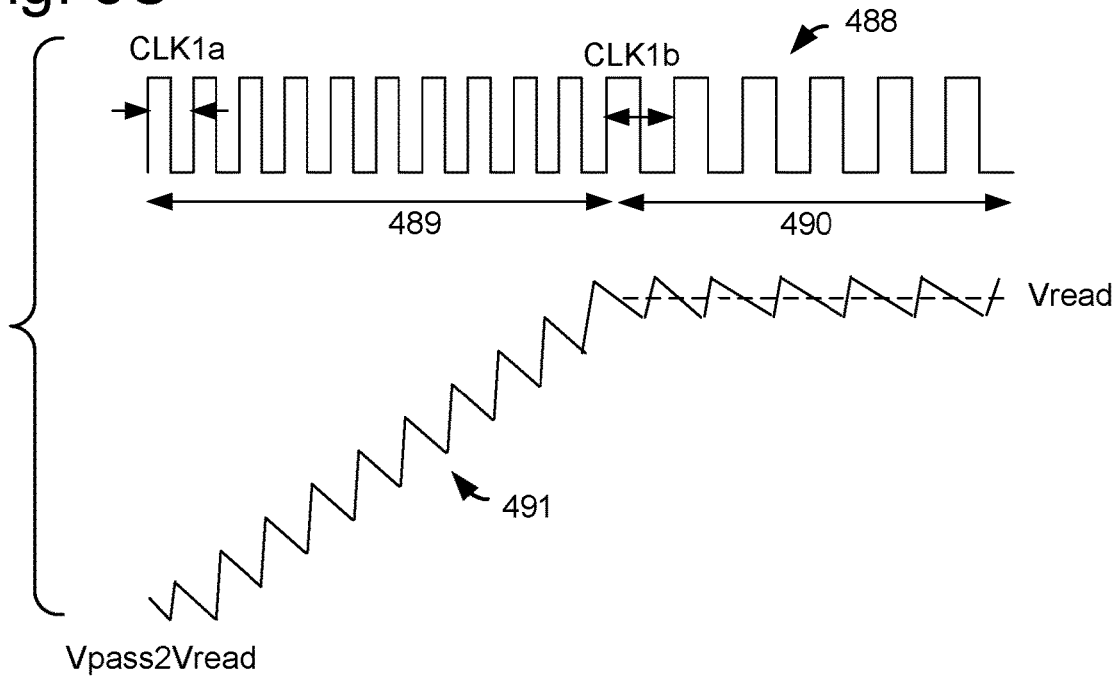
FIG. 3C depicts an example clock signal and output voltage of the charge pump of FIG. 3B where a lower ramp up rate is used.
Figure 3D:
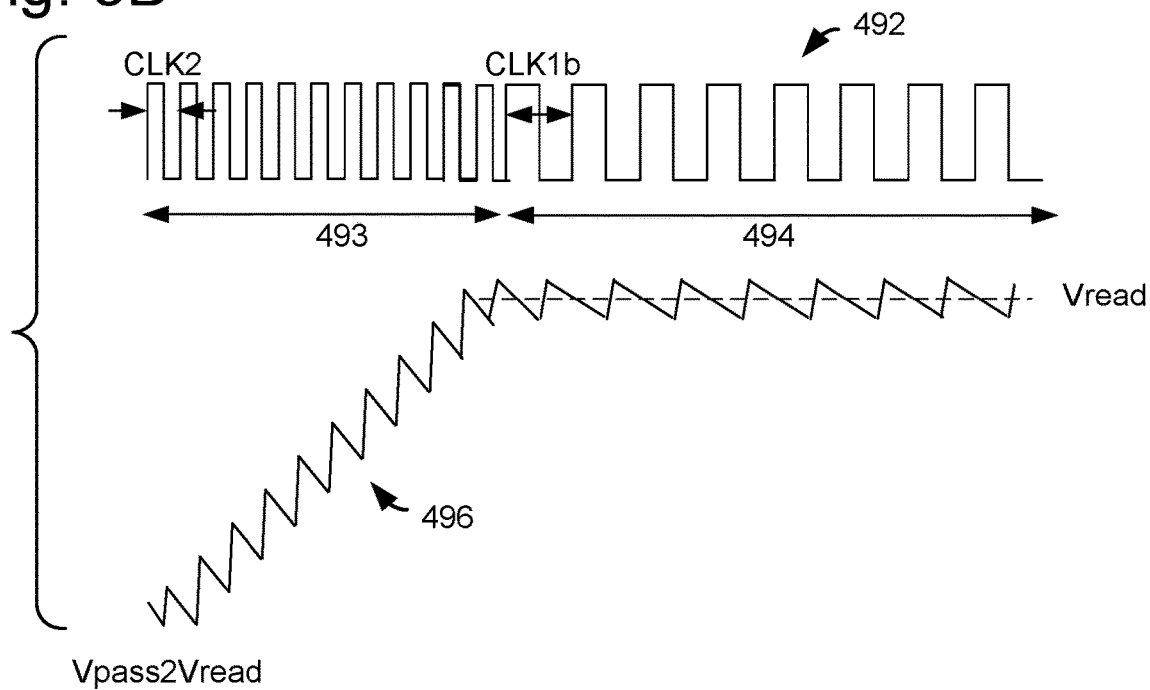
FIG. 3D depicts an example clock signal and output voltage of the charge pump of FIG. 3B where a higher ramp up rate is used.

FIGS. 3C and 3D depicts two example clock signals that are used to achieve different ramp rates for the charge pump of FIG. 3A. FIG. 3C depicts an example clock signal 488 and output voltage 491 of the charge pump of FIG. 3B where a lower ramp up rate (Rlow) is used, e.g., lower relative to the example of FIG. 3D. The clock signal is provided by the control circuitry 477 to activate switches in the stages of the charge pump. The output voltage increases with each charge period, starting from Vpass2Vread and ending at Vread, for example, e.g., 8-10 V. The output voltage has a ripple shape due to the repeated charging and discharging of the capacitors in the charge pump. The clock signal has period CLK1a in a time period 489 in which the output voltage increases. The clock signal then changes to have a period CLK1b>CLK1a in a time period 490 when the output voltage reaches Vread, and the output voltage subsequently remains at Vread. The output voltage can return to 0 V or other initial level at a designated time.

FIG. 3D depicts an example clock signal 492 and output voltage 496 of the charge pump of FIG. 3B where a higher ramp up rate (Rhigh) is used, relative to the example of FIG. 3C. The output voltage increases with each charge period, starting from 0 V and ending at Vread, for example. The clock signal has period CLK2<CLK1a in a time period 493 in which the output voltage increases. The clock signal then changes to have the period CLK1b>CLK2, as in FIG. 3C, in a time period 494 when the output voltage reaches Vread, and the output voltage subsequently remains at Vread.

For example, the lower ramp up rate can be used to reduce peak Icc as discussed herein when performing the first word line voltage refresh operation or read operation after a power up of the memory device and its control circuits. The higher ramp up rate can be used to save time when performing an additional word line voltage refresh operation or read operation, after the first word line voltage refresh operation or read operation.

Figure 3E:
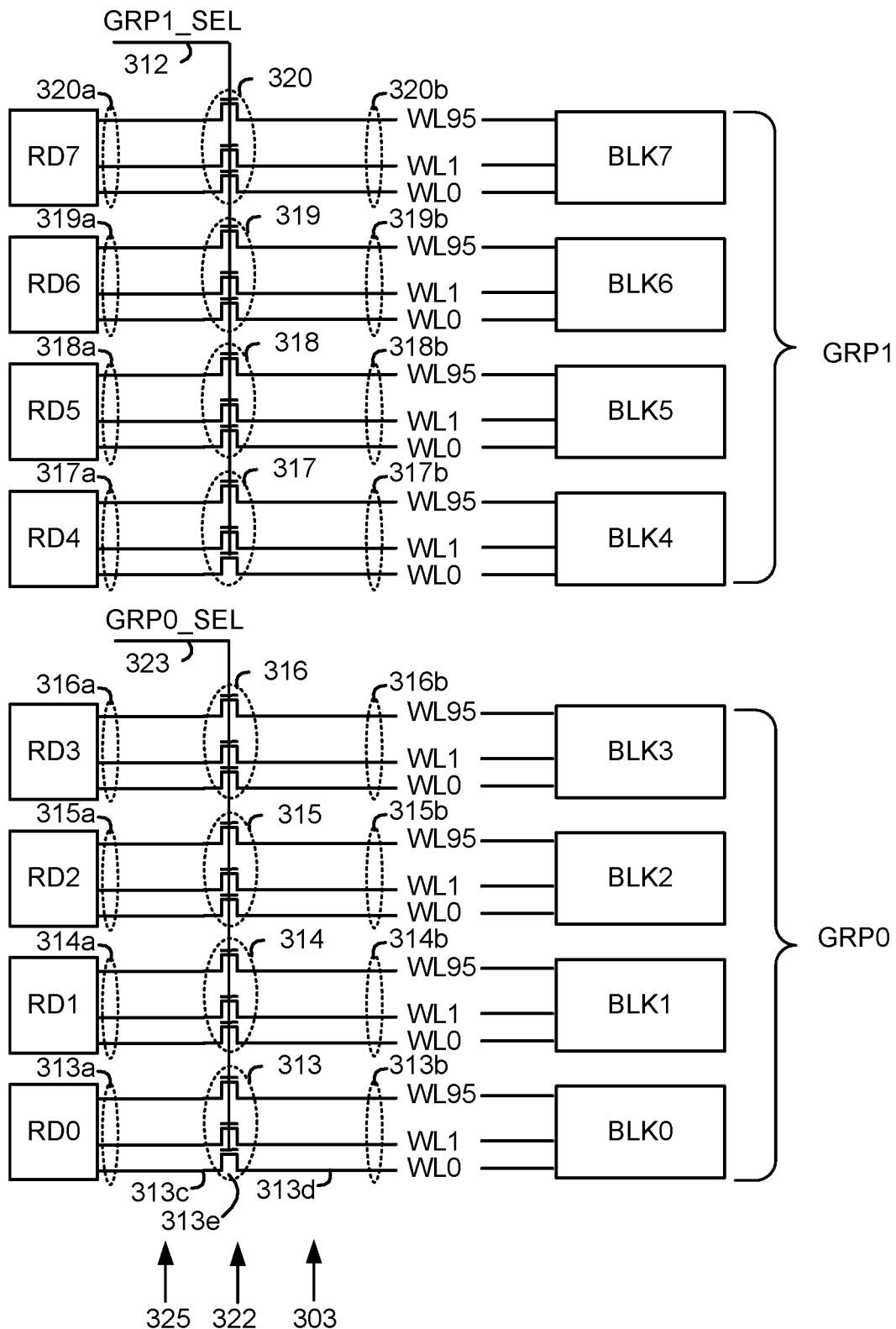
FIG. 3E depicts further example details of the pre-switch control lines 325, pass transistors 322 and post-switch control line 303 of FIG. 3A.

FIG. 3E depicts further example details of the pre-switch control lines 325, pass transistors 322 and post-switch control line 303 of FIG. 3A. RD0-RD7 represent row decoders for BLK0-BLK7, respectively. In GRP0, RD0 is connected to the pre-switch control lines 313a, the pass transistors 313 and the post-switch control lines 313b, e.g., word lines WL0, WL1, . . . , WL95 of BLK0. An example pre-switch control line 313c is connected to a drain terminal of respective pass transistor 313e, which in turn has a source terminal connected to a respective post-switch control line 313d, e.g., WL0. RD1 is connected to the pre-switch control lines 314a, the pass transistors 314 and the post-switch control lines 314b of BLK1. RD2 is connected to the pre-switch control lines 315a, the pass transistors 315 and the post-switch control lines 315b of BLK2. RD3 is connected to the pre-switch control lines 316a, the pass transistors 316 and the post-switch control lines 316b of BLK3. The first group select signal for GRP0, GRP0_SEL, is provided on the first group select line 323 to the control gates of the pass transistors 313-316. The pass transistors may be MOSFETs which are conductive when the voltage on the control line is sufficiently high, e.g., GRP0_SEL is asserted, and non-conductive when the voltage on the control line is sufficiently low or 0 V, e.g., GRP0_SEL is de-asserted (not asserted).

In GRP1, RD4 is connected to the pre-switch control lines 317a, the pass transistors 317 and the post-switch control lines 317b, e.g., word lines WL0-WL95 of BLK4. RD5 is connected to the pre-switch control lines 314a, the pass transistors 318 and the post-switch control lines 318b of BLK5. RD6 is connected to the pre-switch control lines 319a, the pass transistors 319 and the post-switch control lines 319b of BLK6. RD7 is connected to the pre-switch control lines 320a, the pass transistors 320 and the post-switch control lines 320b of BLK7. The second group select signal for GRP1, GRP1_SEL, is provided on the second group select line 312 to the control gates of the pass transistors 317-320. The pass transistors may be MOSFETs, as discussed, which are conductive when GRP1_SEL is asserted and non-conductive when GRP1_SEL is de-asserted.

When a group of blocks is selected, the word line voltages of the associated blocks are no longer floating and are instead driven by a voltage which is provided by the row decoders. In one scenario, a group of blocks is selected to perform a read operation on a selected block of the group. For the selected block, a control gate read voltage can be applied to a selected word line while read pass voltages are applied to the unselected word lines. At the same time, a refresh operation can be performed for the unselected blocks by applying a common refresh voltage signal to the word lines of the unselected blocks.

Figure 4:
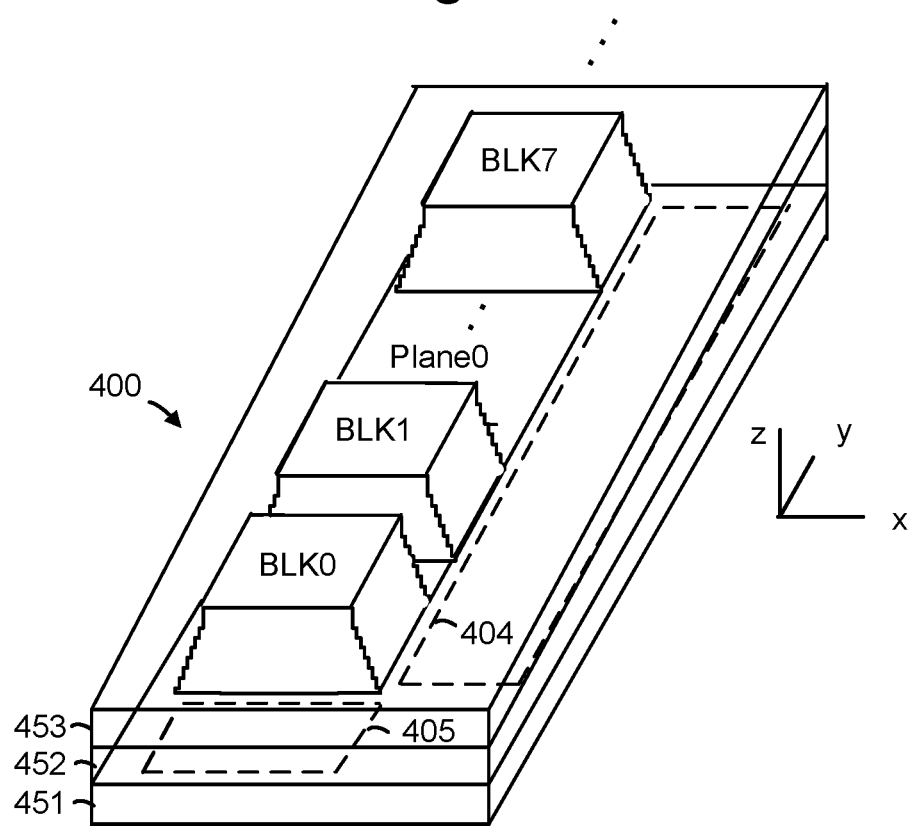
FIG. 4 is a perspective view of a memory device 400 comprising the blocks BLK0-BLK7 of FIG. 3A in an example 3D configuration.

FIG. 4 is a perspective view of a memory device 400 comprising the blocks BLK0-BLK7 of FIG. 3A in an example 3D configuration. The substrate 451 includes a plane, Plane0, on which the example blocks BLK0-BLK7 of memory cells (storage elements) are formed. Peripheral areas with circuitry for use by the blocks are also formed on the substrate. The peripheral area 404 extends along a long edge of the plane, while the peripheral area 405 extends along a short edge of the plane. The circuitry can include voltage drivers which can be connected to control gate layers, bit lines and source lines of the blocks. In one approach, control gate layers at a common height in the blocks are commonly driven. The substrate 451 can also carry circuitry under the blocks, and one or more lower metal layers which are patterned in conductive paths to carry signals of the circuitry. The blocks are formed in an intermediate region 452 of the memory device. In an upper region 453 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While eight blocks are depicted as an example, typically there are many more blocks extending in the x- and/or y-directions, in one or more planes.

In this example, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. When the blocks are in multiple planes, a separate set of bit lines may be used for each plane.

In a stacked memory device such as depicted in FIG. 4 to 7B, sets of connected memory cells may be arranged in NAND strings which extend vertically upward from the substrate. The bottom (or source end) of each NAND string is in contact with the substrate, e.g., the well region, and the top end (or drain end) of each NAND string is connected to a respective bit line, in one approach.

Figure 5:
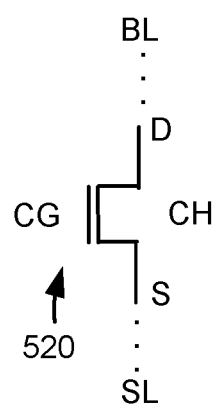
FIG. 5 depicts an example transistor 520 in the memory structure 126 of FIG. 1A.

FIG. 5 depicts an example transistor 520 in the memory structure 126 of FIG. 1A. The transistor comprises a control gate CG, a drain D, a source S and a channel CH and may represent a memory cell or a select gate transistor, for example. The control gate of the transistor is connected to a word line, the drain end of the transistor is connected to a bit line BL optionally via one or more other transistors in a NAND string, and the source end of the transistor is connected to a source line SL optionally via one or more other transistors in a NAND string.

Figure 6A:
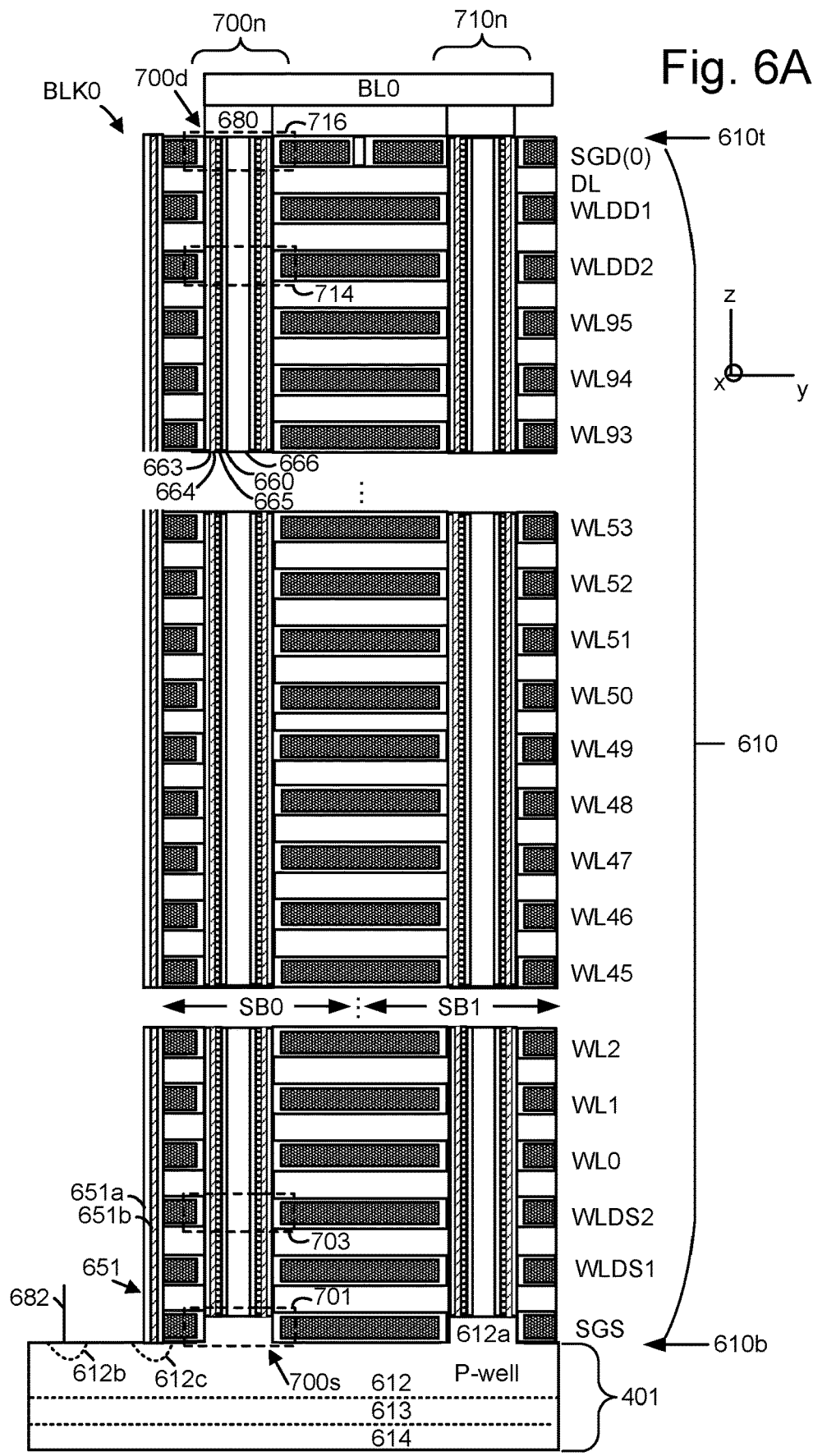
FIG. 6A depicts an example cross-sectional view of a portion of the block BLK0 of FIG. 4, including NAND strings 700n and 710n, in a single-tier stack.

FIG. 6A depicts an example cross-sectional view of a portion of the block BLK0 of FIG. 4, including NAND strings 700n and 710n, in a single-tier stack. In this example, the NAND strings 700n and 710n are in different sub-blocks SB0 and SB1, respectively, and are connected to a common bit line, BL0. The block comprises a stack 610 of alternating conductive layers (word line layers) and dielectric layers. The layers may be rectangular plates having a height in the z direction, a width in the y direction, and a length in the x direction.

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS1, WLDS2, WL0-WL95, WLDD2, WLDD1 and SGD(0). The conductive layers connected to control gates of data memory cells are referred to as data word lines. A controller considers the data memory cells to be eligible to store user data. In this example, the stack includes ninety-six data word lines, WL0-WL95. The data word lines are separated by dielectric layers. DL is an example dielectric layer.

The conductive layers connected to control gates of dummy memory cells are referred to as dummy word lines. Dummy memory cells can have the same construction as data memory cells but are considered by the controller to be ineligible to store any type of data including user data. The dummy memory cells can provide a buffer region such as to provide a gradual transition in the channel voltage. This helps prevent disturbs of data memory cells. One or more dummy memory cells may be provided at the drain and/or source ends of a NAND string of memory cells. In a multi-tier stack, dummy memory cells can be provided adjacent to the interface, above and below the interface. For example, see FIG. 6B, and the upper and lower interface dummy word lines, WLIFDU and WLIFDL, respectively.

The conductive layers connected to control gates of source-side select gate transistors (SGS transistors) and drain-side select gate transistors (SGD transistors) are referred to as source-side and drain-side control lines, respectively. The SGD transistor is used to electrically connect the drain end of a NAND string to a bit line, and the SGS transistor is used to electrically connect the source end of a NAND string to a source line, as is appropriate during various operations including programming, erasing and reading.

A top 610t and bottom 610b of the stack are depicted. WL95 is the topmost data word line or conductive layer and WL0 is the bottommost data word line or conductive layer.

The NAND strings are formed by etching memory holes in the stack, then depositing multiple thin layers of materials along the sidewalls of the memory holes. Memory cells are formed in a region in which the word lines intersect with the multiple thin layers, and select gate transistors are formed in regions in which the SGS and SGD control lines intersect with the multiple thin layers. For example, a drain-side select gate transistor 716 is formed where the SGD control line intersects with the multiple thin layers, a source-side select gate transistor 701 is formed where the SGS control line intersects with the multiple thin layers, a topmost data memory cell 714 is formed where the WL95 word line intersects with the multiple thin layers, and a bottom most data memory cell 703 is formed where the WL0 word line intersects with the multiple thin layers.

The multiple thin layers can form annular layers and can be deposited, e.g., using atomic layer deposition. For example, the layers can include a blocking oxide layer 663, a charge-trapping layer 664 or film such as silicon nitride (Si3N4) or other nitride, a tunnel oxide layer 665 (e.g., a gate oxide) and a channel 660 (e.g., comprising polysilicon). A dielectric core 666 (e.g., comprising silicon dioxide) can also be provided. A word line or control line can comprise a metal such as Tungsten. In this example, all of the layers are provided in the memory hole. In other approaches, some of the layers can be provided in the word line or control line layer. The multiple thin layers form a columnar active area (AA) of a NAND string.

The stack is formed on a substrate 401. In one approach, the substrate includes a p-well region 612 (see also FIG. 3A) connected to the source ends of the NAND strings. The p-well region may comprise epitaxial regions 612a which extend upward adjacent to the source-side select gate transistors. The p-well region can include an n+ contact 612c connected to a local interconnect 651 for receiving a source line voltage, and a p+ contact 612b connected to a conductive path 682 for receiving a p-well voltage. The local interconnect 651 can comprise a conductive material 651b such as metal surrounded by insulating material 651a to prevent conduction with the metal of the adjacent word lines. The p-well region is formed in an n-well 613, which in turn is formed in a p-type semiconductor region 614 of the substrate, in one possible implementation.

The NAND string 700n has a source end 700s at a bottom 610b of the stack 610, connected to the p-well. The NAND string 700n also has a drain end 700d at atop 610t of the stack, connected to a bit line BL0 via a bit line contact 680 comprising an n-type material.

The NAND strings can be considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer, e.g., a tunnel oxide layer. The Vth of a memory cell is increased in proportion to the amount of stored charge. During an erase operation, the channels of the NAND string are charged up, such as by applying a positive erase pulse to the substrate via the local interconnect 651, causing the electrons to return to the channel from the charge trapping layer.

In this example, the SGS transistors do not include the multiple thin layers 660, 663, 664 and 665.

Figure 6B:
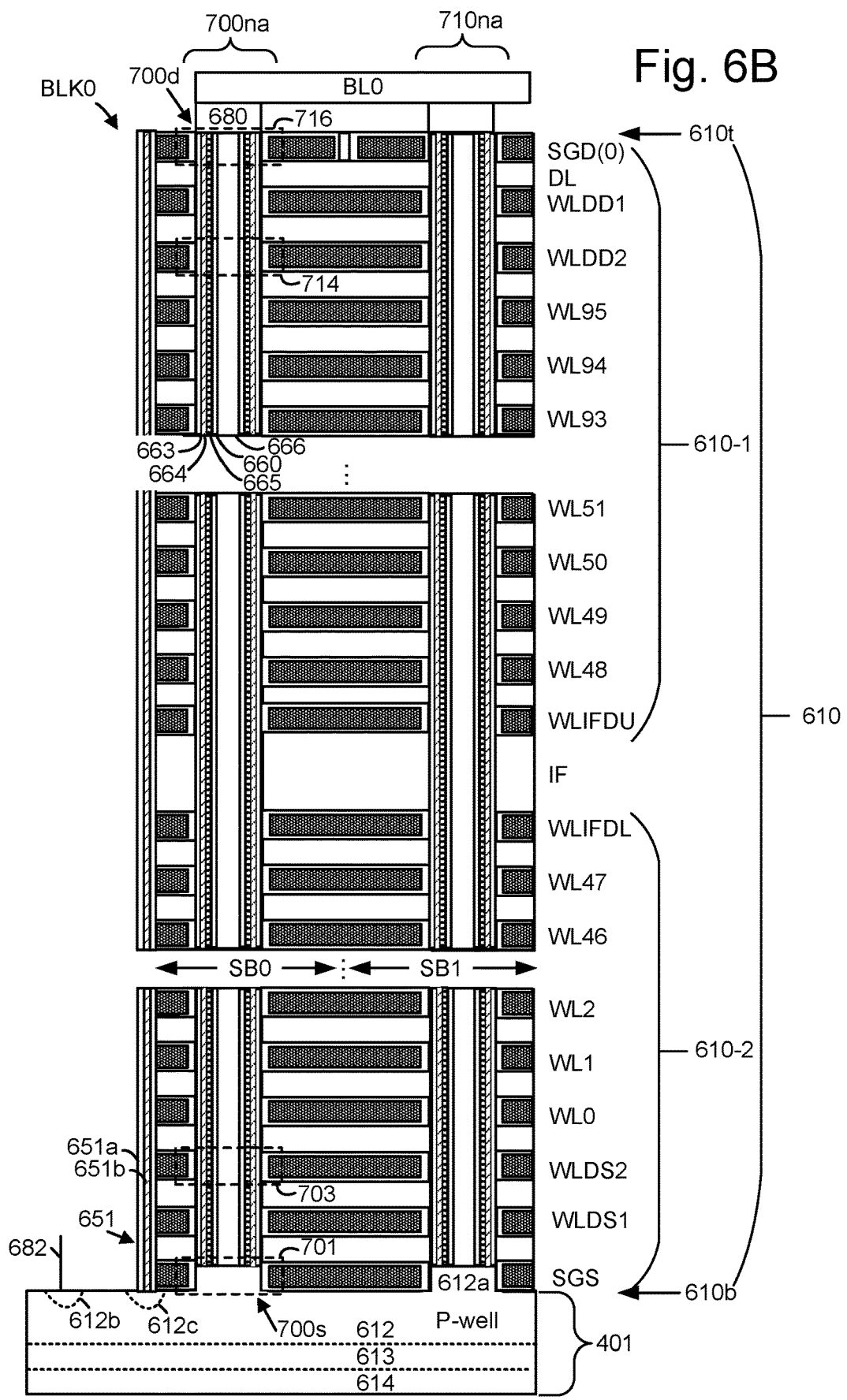
FIG. 6B depicts an example cross-sectional view of a portion of the block BLK0 of FIG. 4, including NAND strings 700na and 710na, in a two-tier stack comprising an upper tier 610-1 and a lower tier 610-2.

FIG. 6B depicts an example cross-sectional view of a portion of BLK0 of FIG. 4, including NAND strings 700na and 710na, in a two-tier stack comprising an upper tier 610-1 and a lower tier 610-2. A two-tier other multi-tier stack can be used to form a relatively tall stack while maintaining a relatively narrow memory hole width. After the layers of the lower tier are formed, memory hole portions are formed in the lower tier. Subsequently, after the layers of the upper tier are formed, memory hole portions are formed in the upper tier, aligned with the memory hole portions in the lower tier to form continuous memory holes from the bottom to the top of the stack. The resulting memory hole is narrower than would be the case if the hole was etched from the top to the bottom of the stack rather than in each tier individually. An interface (IF) region is created where the two tiers are connected. The IF region is typically thicker than the other dielectric layers. Due to the presence of the IF region, the adjacent word line layers suffer from edge effects such as difficulty in programming or erasing. These adjacent word line layers can therefore be set as dummy word lines.

Figure 7A:
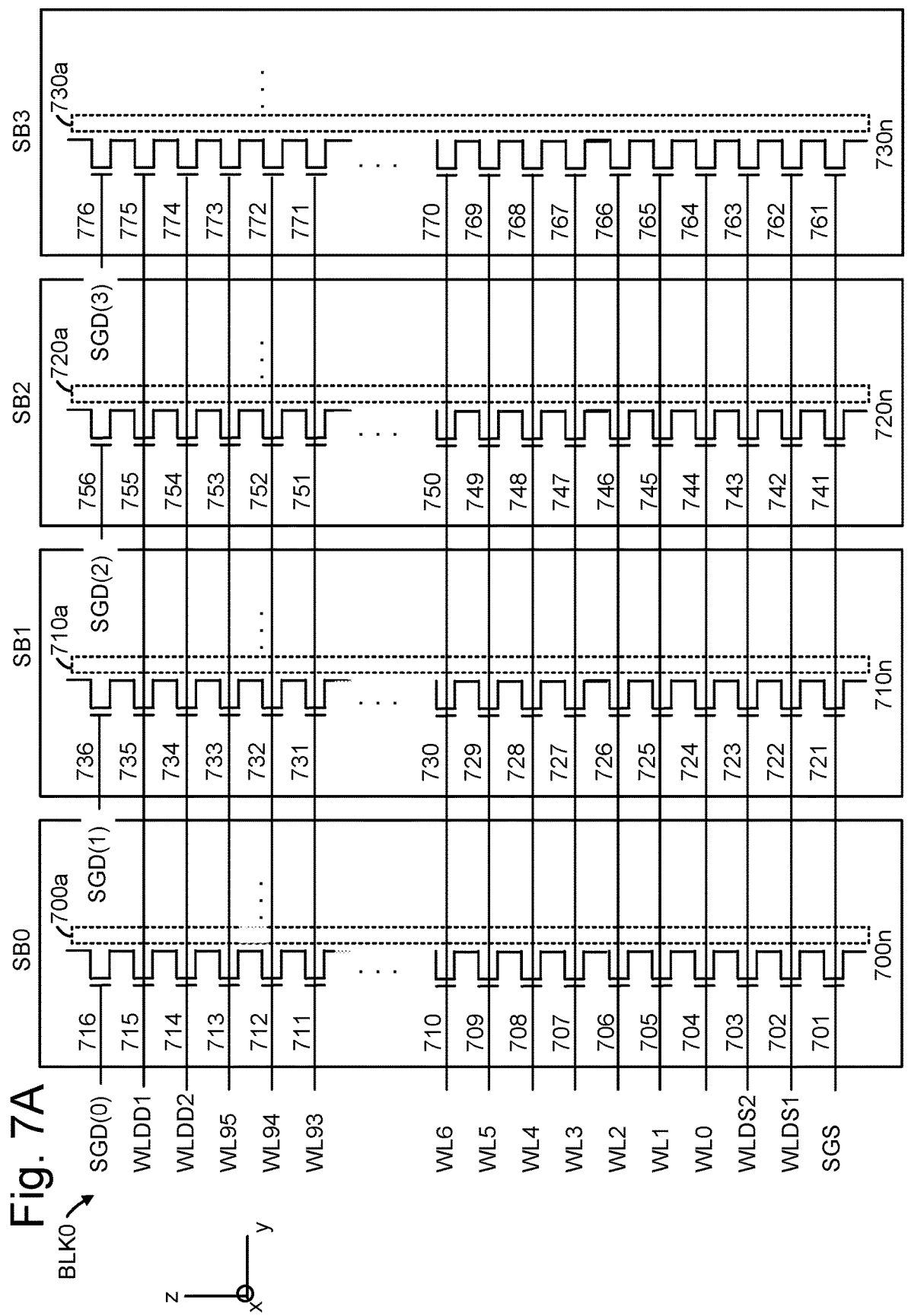
FIG. 7A depicts an example view of NAND strings in the block BLK0 which is consistent with FIGS. 4 and 6A.

FIG. 7A depicts an example view of NAND strings in the block BLK0 which is consistent with FIGS. 4 and 6A. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively. Programming of the block may occur based on a word line and sub-block programming order. One option is to program the memory cells in different portions of a word line which are in the different sub-blocks, one sub-block at a time, before programming the memory cells of the next word line. For example, this can involve programming WL0 in SB0, SB1, SB2 and then SB2, then programming WL1 in SB0, SB1, SB2 and then SB2, and so forth. The word line programming order may start at WL0, the source-end word line and end at WL95, the drain-end word line, for example.

Another option is to program each sub-block before proceeding to the next sub-block. For example, SB0 may be programmed in WL0-WL95, then SB1 may be programmed in WL0-WL95, and so forth.

The NAND strings 700n, 710n, 720n and 730n have channels 700a, 710a, 720a and 730a, respectively. Additionally, NAND string 700n includes SGS transistor 701, dummy memory cell 702, data memory cells 703-714, dummy memory cell 715 and SGD transistor 716. NAND string 710n includes SGS transistor 721, dummy memory cell 722, data memory cells 723-734, dummy memory cell 735 and SGD transistor 736. NAND string 720n includes SGS transistor 741, dummy memory cell 742, data memory cells 743-754, dummy memory cell 755 and SGD transistor 756. NAND string 730n includes SGS transistor 761, dummy memory cell 762, data memory cells 763-774, dummy memory cell 775 and SGD transistor 776.

This example depicts one SGD transistor at the drain-end of each NAND string, and one SGS transistor at the source-end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

FIG. 7B depicts an example top view of the block BLK0 of FIG. 7A, with respective NAND strings, bit lines and sense circuits. The view is in the x-y plane. Each circle represents a NAND string. In this example, sixteen NAND strings per sub-block are depicted. SB0 includes the NAND string 700n of FIG. 7A and additional NAND strings 700n1-700n15. SB1 includes the NAND string 710n of FIG. 7A and additional NAND strings 710n1-710n15. SB2 includes the NAND string 720n of FIG. 7A and additional NAND strings 720n1-720n15. SB3 includes the NAND string 730n of FIG. 7A and additional NAND strings 730n1-730n15.

A set of bit lines BL0-BL15 are connected to the NAND strings. Each bit line is connected to a respective set of NAND strings, including one NAND string in each sub-block. For example, BL0 is connected to NAND strings 700n, 710n, 720n and 730n in a set of NAND strings 799, BL1 is connected to NAND strings 700n1, 710n1, 720n1 and 730n1, and so forth. Each bit line is also connected to a respective sense circuit, consistent with the sense circuits 60-63 of FIG. 2. For example, BL0-BL15 are connected to sense circuits SC0-SC15, respectively.

Figure 8A:
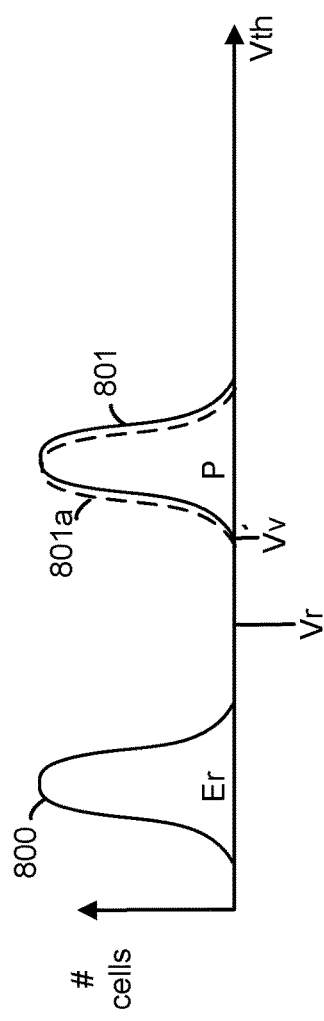
FIG. 8A depicts example Vth distributions of SLC memory cells storing one bit per cell.
Figure 8B:
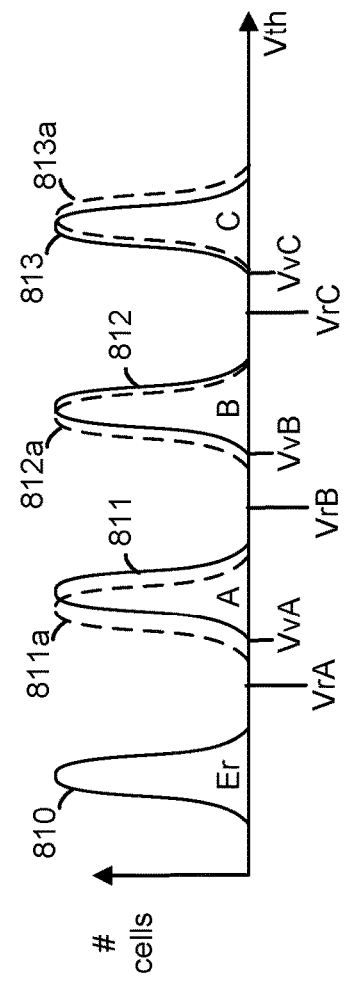
FIG. 8B depicts example Vth distributions of MLC memory cells storing two bits per cell.
Figure 8C:
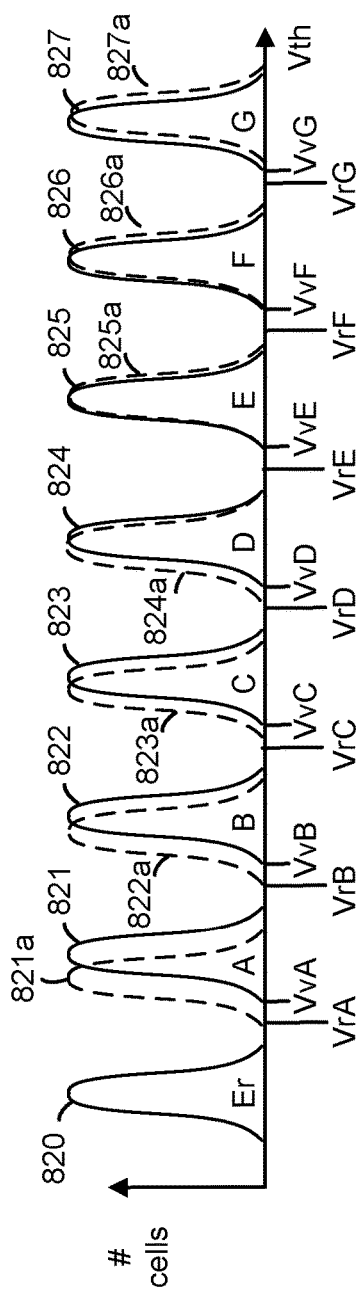
FIG. 8C depicts example Vth distributions of MLC memory cells storing three bits per cell.

FIG. 8A depicts example Vth distributions of SLC memory cells storing one bit per cell. In FIG. 8A to 8C, the vertical axis represents a number of memory cells on a logarithmic scale and the horizontal axis represents Vth in Volts.

During a programming operation, the final Vth distribution can be achieved by using one or more programming passes. Each pass may use incremental step pulse programming, for instance. During a programming pass, program-verify iterations are performed for a selected word line. A program-verify iteration comprises a program portion in which a program voltage is applied to the word line followed by a verify portion in which one or more verify tests are performed. Each programmed state has a verify voltage which is used in the verify test for the state.

The Vth distribution 800 represent an erased state (Er). The Vth distributions 801 and 801a represent a programmed data state (P) in the second and first read states, respectively. The higher Vth distribution 801 is caused by a coupled up word line voltage, while the lower Vth distribution 801a is caused by a discharge in the word line voltage.

A verify voltage for the programmed state is Vv and a read voltage for distinguishing between the two states is Vr.

FIG. 8B depicts example Vth distributions of MLC memory cells storing two bits per cell. The Er state is represented by the Vth distribution 810. The A-C data states are represented by the Vth distributions 811-813, respectively, in the second read state, and by the Vth distributions 811a-813a, respectively, in the first read state. The verify voltages are VvA-VvC, and the read voltages are VrA-VrC. The Vth downshift due to being in the first read state is greater for the A state than for the B and C states in this example. For the higher data states, the coupling up voltage between the channel and the word line is typically not strong enough to trap more electrons in the charge trapping layer of a memory cell. This is due to a screening effect of the electrons which are already present in the charge trapping layer of the memory cell and provide the high Vth. Instead, the electrons in the charge trapping layer are more attracted towards the control gate/word line, further away from the channel, resulting in a Vth downshift. Data retention effects may also be present for the higher data states, where charge is lost from the charge trapping layer, resulting in a Vth downshift.

FIG. 8C depicts example Vth distributions of MLC memory cells storing three bits per cell. The Er state is represented by the Vth distribution 820. The A-G data states are represented by the Vth distributions 821-827, respectively, in the second read state, and by the Vth distributions 821a-827a, respectively, in the first read state.

The verify voltages of the A-G states are VvA-VvG, respectively. A set of read voltages for the A-G states includes VrA-VrG, respectively. The read voltages can be optimized for the second read state, in one approach. In this example, the Vth distributions 821-824 for the A-D states, respectively, have a Vth upshift in the second read state. The Vth distributions 826 and 827 for the F and G states, respectively, have a small Vth downshift, in the second read state.

With three bits per cell, three pages of data can be stored in the memory cells connected to a word line. The data of the lower, middle and upper pages can be determined by reading the memory cells using read voltages of VrA and VrE; VrB; and VrC and VrG, respectively.

Figure 9A:
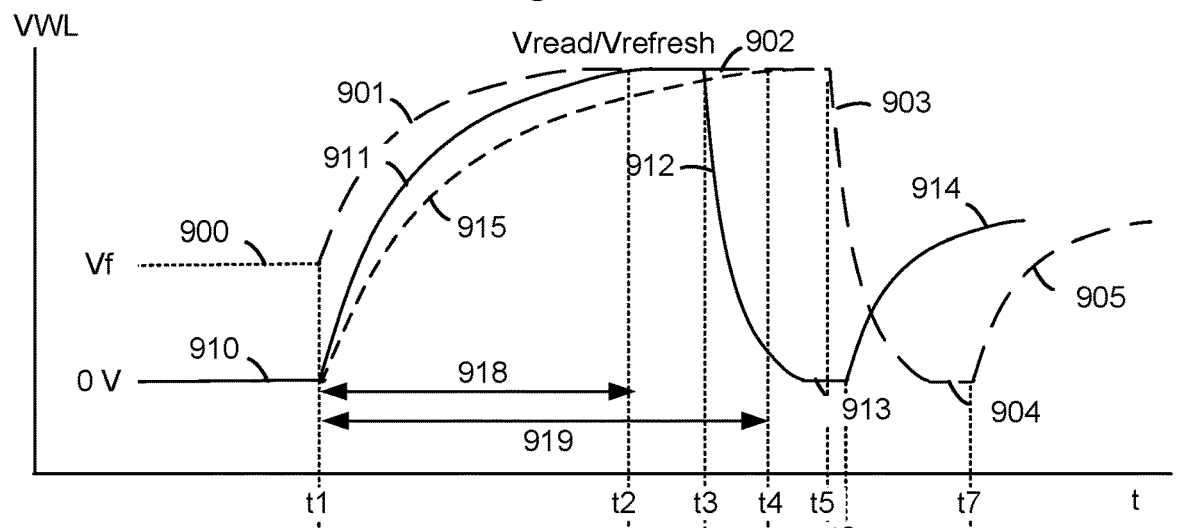
FIG. 9A depicts example voltages applied to word lines in a word line voltage refresh operation.
Figure 9B:
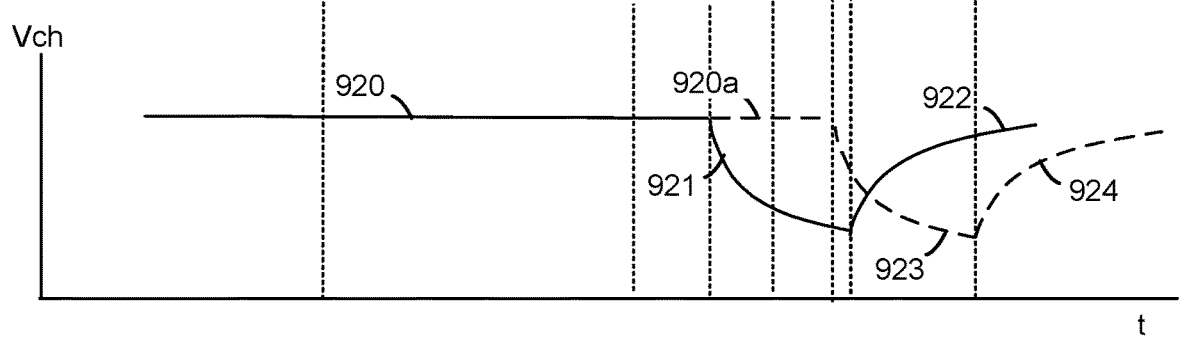
FIG. 9B depicts an example channel voltage in a NAND string, consistent with FIG. 9A.

In FIGS. 9A and 9B, the vertical direction denotes word line voltage and the horizontal direction denotes time, with time points t1-t7.

FIG. 9A depicts example voltages applied to word lines in a word line voltage refresh operation. The refresh operation is performed by applying a voltage pulse to a set of word lines. A similar voltage pulse can be used in a read operation. VWL denotes the word line voltage. For a word line voltage refresh operation, VWL could be applied to each of the word lines in a block. For a read operation, VWL could be applied to the unselected word lines in a block. Three examples of a voltage signal comprising a voltage pulse are depicted.

In a first example, the word lines are in the first read state so that VWL is at a relatively low initial level such as of 0 V (plot 910) and is increased to a peak level of Vread or Vrefresh in a read operation of refresh operation, respectively, as shown by a plot 911 in a time period t1-t2 represented by the arrow 918. The increase or ramp up rate is relatively high so that the ramp up period is relatively short. This will result in a relatively high peak Icc. The voltage is maintained at Vread/Vrefresh from t2-t3, as represented by a portion of a plot 902, then decreased to a lower level such as 0 V as represented by the plot 912, and maintained at 0 V until t6 as represented by the plot 913. The voltage then begins floating higher at t6 as represented by the plot 914 due to capacitive coupling from the channel.

In a second example, the word lines are again in the first read state as represent by the plot 910. However, the increase to Vread/Vrefresh is at a reduced rate so that a power-saving technique is implemented. The plot 915 represents the increase from 0 V to Vread/Vrefresh in a time period t1-t4 represented by the arrow 919. The increase or ramp up rate is relatively low so that the ramp up period is relatively long. This will result in a lower peak Icc. The voltage is maintained at Vread/Vrefresh from t4-t5, then decreased to a lower level such as 0 V at t5 as represented by the plot 903, and maintained at 0 V until t7 as represented by the plot 904. The voltage then begins floating higher at t7 as represented by the plot 905 due to capacitive coupling from the channel.

In a third example, the word lines are in the second read state, at a floating voltage Vf>0 V, as represent by the plot 900. In this case, the power-saving technique is not indicated. The plot 901 represents the increase from Vf to Vread/Vrefresh in a relatively short time period t1-t2 represented by the arrow 918. Although the ramp up rate is relatively high, the amount of the ramp up, Vread/Vrefresh-Vf, is lower than Vread/Vrefresh-0 V, so that the peak Icc is not excessive. As in the first example, the voltage is maintained at Vread/Vrefresh from t2-t3, then decreased to a lower level at t3 such as 0 V (plot 912), and maintained at 0 V until t6 (plot 913). The voltage then begins floating higher at t6 (plot 914).

FIG. 9B depicts an example channel voltage (Vch) in a NAND string, consistent with FIG. 9A. Vch is initially at or near 0 V as represented by the plot 920. In one option, which is consistent with plots 912-914 of FIG. 9A, Vch decreases due to down coupling from the word lines at t3-t6 (plot 921), then recovers back toward 0 V starting at t6 (plot 922). This increase in Vch couples up the word line voltage as indicated by the plot 914. The down coupling and up coupling is due to capacitive coupling between the channel and the word lines.

In another option, which is consistent with plots 903-905 of FIG. 9A, Vch is at 0 V (plot 920a) before decreasing due to down coupling from the word lines at t5-t7 (plot 923), then recovers back toward 0 V starting at t7 (plot 924). This increase in Vch couples up the word line voltage as indicated by the plot 905.

Figure 9C:
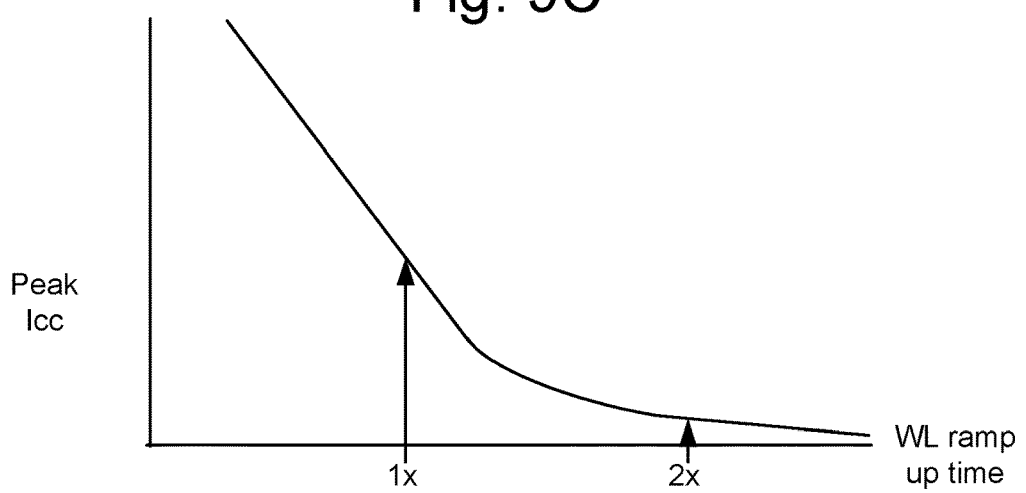
FIG. 9C depicts a plot of peak Icc versus word line voltage ramp up time, consistent with FIG. 9A.

FIG. 9C depicts a plot of peak Icc versus word line voltage ramp up time, consistent with FIG. 9A. As mentioned, a power-saving technique as discussed herein can involve a reduced ramp up rate and increased ramp up time, for the word line voltages. This example shows how the peak Icc decreases when the ramp up time is doubled, e.g., from 1× to 2×.

Figure 10A:
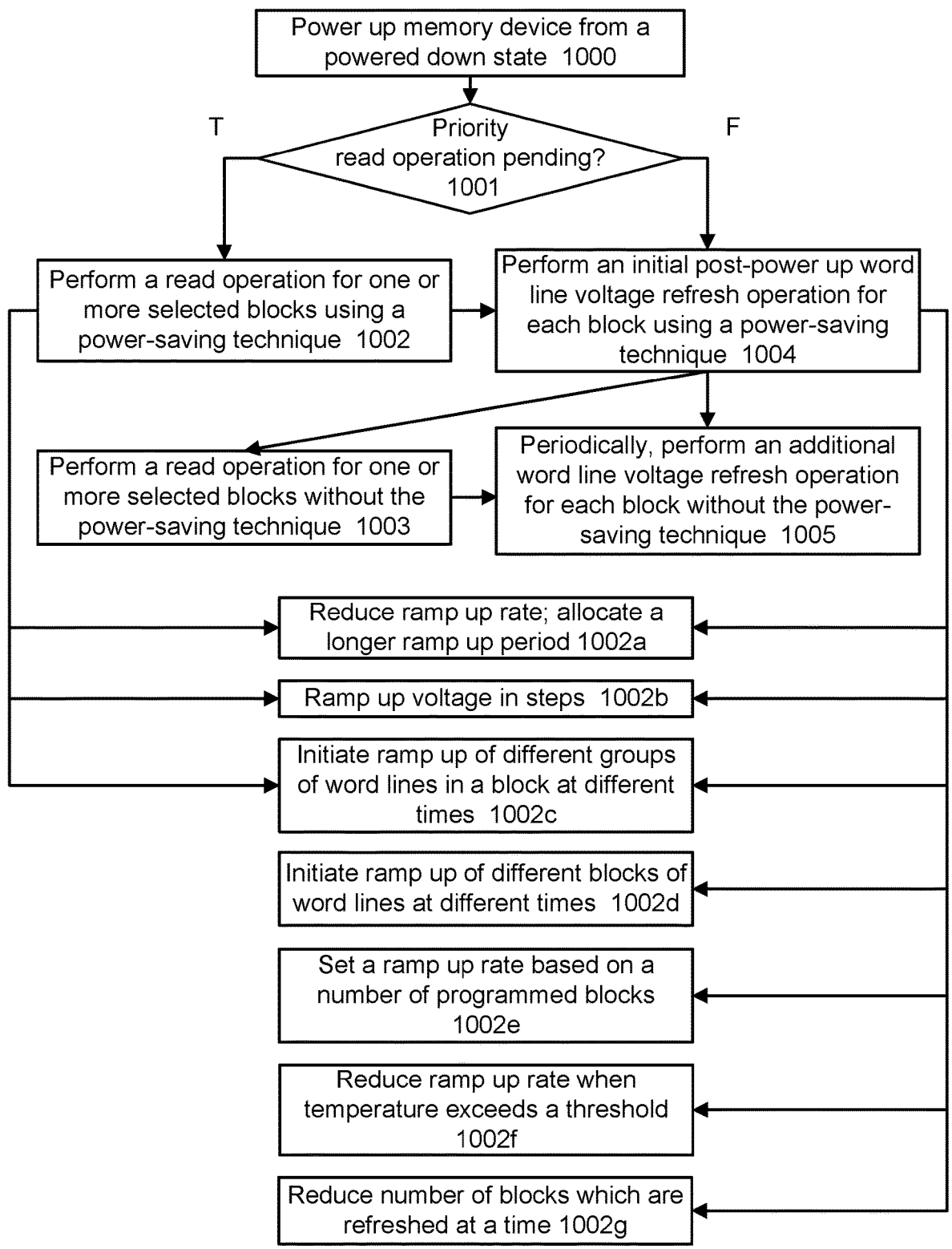
FIG. 10A depicts a flowchart of an example process for performing a word line voltage refresh operation or a read operation after powering up a control circuit.

FIG. 10A depicts a flowchart of an example process for performing a word line voltage refresh operation or a read operation after powering up a control circuit. Step 1000 includes powering up a memory device from a powered down state, e.g., in which the refresh operation does not occur. A powered down state can include an off state or a sleep state, for example, in which power is removed from one or more components. In an off state, power may be removed from each of the components in the device, e.g., on the chip. In a sleep state, powered is provided for some components but not others. For example, power can be maintained for a control circuit such as the controller 122 of FIG. 1A, which removes power from designated components on the chip such as the circuitry 110 in the sleep state. To power up from the off state, the power is restored to each of the components. To power up from the sleep state, the control circuit can restore the power to the designated components. The off state or sleep state can be entered based on a user command, or by an automatic process at a control circuit which detects the lack of use of the memory device, or other reasons.

A decision step 1001 determines if a priority read operation is pending. This is a read operation which has a higher priority than a word line voltage refresh operation. In some cases, any pending read operation has a higher priority than a word line voltage refresh operation. In other cases, a read operation can have a higher or lower priority than a pending initial post-power up word line voltage refresh operation. If the decision step 1001 is true (T), step 1002 performs a read operation for one or more selected blocks using a power-saving technique, such as depicted in steps 1002a-1002c. This can be a read operation for a page of data such as depicted by the voltage pulse 1111 in FIG. 11B. Additionally, step 1004 can be performed directly after step 1002. Step 1004 includes performing an initial post-power up word line voltage refresh operation for each block using a power saving technique, such as depicted in steps 1002a-1002g and by the voltage pulse 1101 in FIG. 11A. This ensures that each block is placed in the second read state, including those which are not among the one or more selected blocks of step 1002. Step 1004 is also reached if the decision step is false (F). As mentioned, this refresh operation provides the word lines in the second read state in preparation for a subsequent read operation. The initial post-power up word line voltage refresh operation is the first refresh operation performed after the power up.

Thus, the initial post-power up refresh operation uses a power-saving technique. Moreover, if a read operation is performed at step 1002 before the initial post-power up refresh operation, that read operation also uses a power-saving technique. The subsequent read operations at step 1003 and word line voltage refresh operations at step 1005 can omit the power-saving technique, to save time, in one approach. For example, after step 1004, step 1003 or 1005 can be performed. Step 1003 performs a read operation for one or more selected blocks without using the power-saving technique of step 1002. Step 1005 involves performing an additional word line voltage refresh operation for each block without the power-saving technique of step 1004.

Figure 14A:
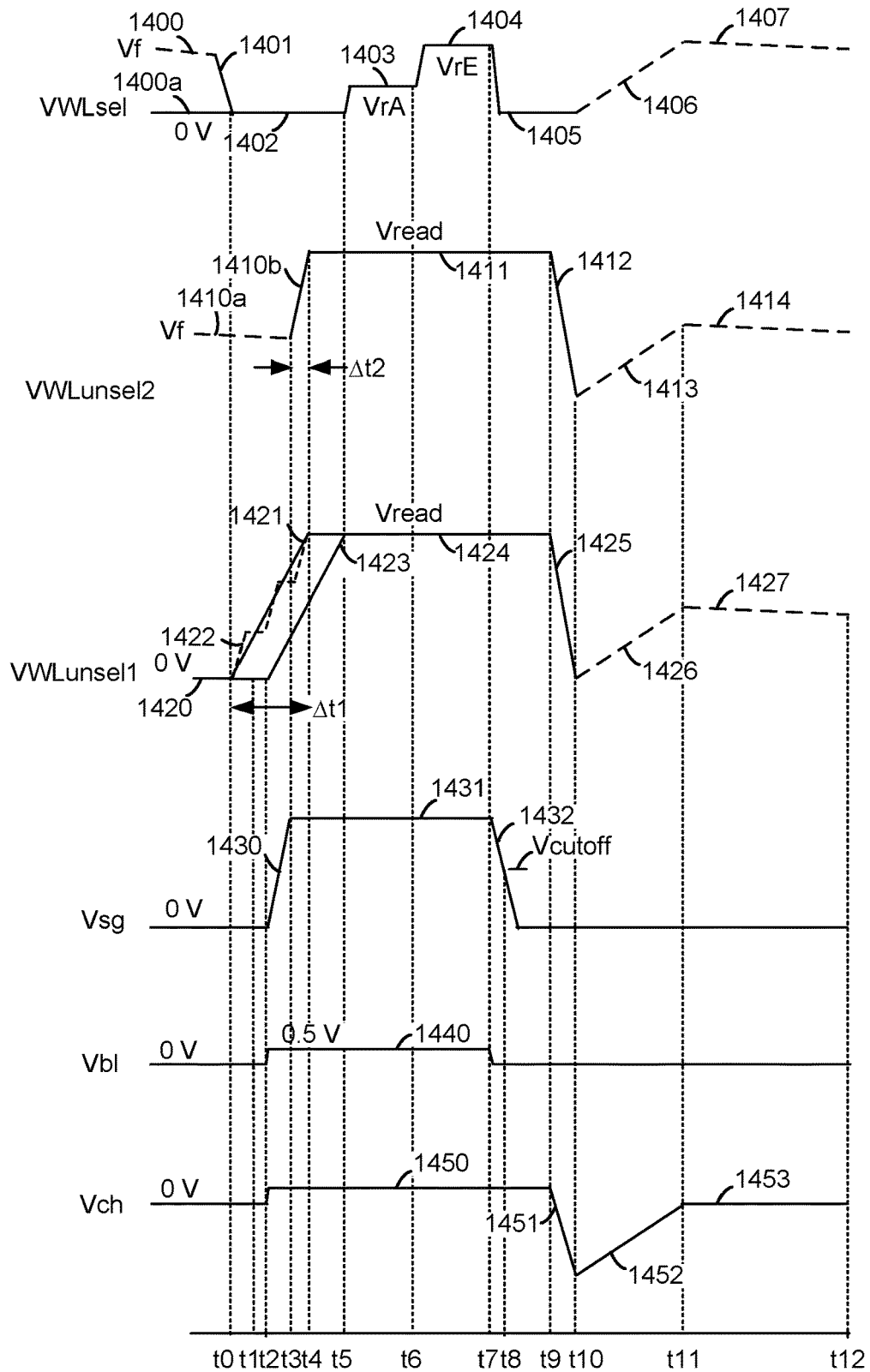
FIG. 14A depicts example waveforms in a read operation consistent with the process of FIG. 10A, steps 1002 and 1003.

One or more of steps 1002a-1002g can be used to implement a power-saving technique. Step 1002a includes reducing a ramp up rate and allocating a longer ramp up period, such as discussed in connection with FIG. 9A. In some cases, if the ramp rate is reduced without increasing the ramp up period, the voltage may not reach Vread. The time penalty in this case is a worthy tradeoff since it ensures the word lines are in the second read state in preparation for a subsequent read operation. Step 1002b includes attainment of Vread or Vrefresh in multiple steps with reduced peak magnitude of the voltage pulse for the first step or for the first few steps. See FIG. 14A, plot 1422.

Step 1002c includes initiating a ramp up of different group of word lines in a block at different times. For example, the odd-numbered word lines could be ramped up first, followed by the even-numbered word lines. Or, the lower half of the word lines, e.g., WL0-WL47 in FIG. 7A, can be ramped up first, followed by the upper half of the word lines, e.g., WL48-WL95. See also FIG. 14A, comparing the ramp up of plot 1421 or 1422, representing the voltage of one group of the word lines, to the ramp up of plot 1423, representing the voltage of another group of the word lines. More than two groups could be used as well. By offsetting the initiating of the ramp up, peak Icc is reduced since the number of word lines being ramped up together is reduced.

Step 1002d includes initiating the ramp up of different blocks of word lines at different times. For example, in FIG. 3E, the word lines of GRP0 can be ramped up before the word lines of GRP1. Or, within GRP0, the word lines of BLK0 and BLK1 can be ramped up before the word lines of BLK2 and BLK3. As with step 1002c, peak Icc is reduced since the number of word lines being ramped up together is reduced. For example, see FIG. 14A, comparing the ramp up of plot 1421 or 1422, representing the voltage of one group of the blocks, to the ramp up of plot 1423, representing the voltage of another group of blocks.

Figure 14B:
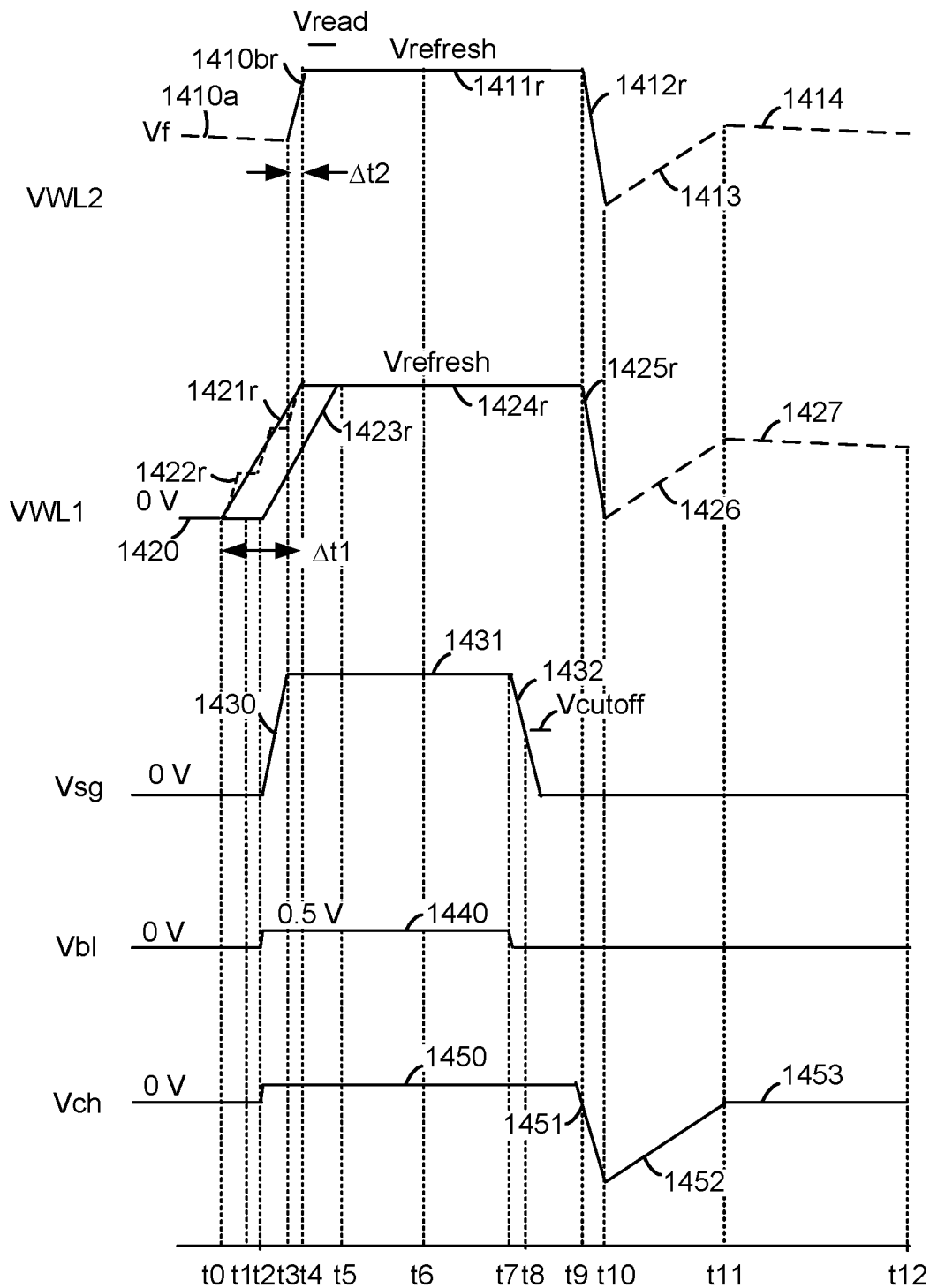
FIG. 14B depicts example waveforms in a word line voltage refresh operation consistent with the process of FIG. 10A, steps 1004 and 1005.

In one approach, a control circuit can be configured to initiate a ramp up of a first voltage pulse (e.g., starting at t0 with a voltage pulse comprising plots 1421r, 1424r and 1425r in FIG. 14B) for one group of blocks, and to initiate a ramp up of a second voltage pulse (e.g., starting at t2 with a voltage pulse comprising plots 1423r, 1424r and 1425r) for another group of word lines.

Step 1002e includes setting a ramp up rate based on a number of programmed blocks. For example, using the table 117 of FIG. 12, the programmed and erased blocks can be distinguished, and the word line voltage refresh operation can be performed for the programmed block but not the erased blocks. Peak Icc is reduced since the number of word lines being ramped up is reduced. In another option, to implement the power-saving technique, a control circuit is configured to determine that a number of the programmed blocks exceeds a threshold and set a reduced ramp up rate of the refresh voltage pulse in response to the determining that the number of the programmed blocks exceeds the threshold. That is, the power-saving technique can be omitted if the number of the programmed blocks does not exceed the threshold. The threshold could be 25-50% of the blocks, for example.

Step 1002f includes reducing a ramp up rate when the temperature exceeds a threshold, such as depicted in FIG. 13. Peak Icc is higher when the temperature is higher, so this step avoids an increase in peak Icc at higher temperatures which would otherwise occur.

Step 1002g includes reducing the number of blocks which are refreshed at a time, e.g., concurrently. For example, to implement the power-saving technique when the word lines are in the first read state, a control circuit can be configured to apply a first voltage refresh pulse (e.g., plots 1421r, 1424r and 1425r in FIG. 14B) with a low ramp up rate to word lines of N blocks at a time. At other times, when the power-saving technique is not needed and the word lines are in the second read state, such as in step 1005, the control circuit is configured to apply a second voltage refresh pulse (e.g., plots 1410br, 1411r and 1412r) with a high ramp up rate to word lines of M>N blocks at a time, where M and N are positive integers. For example, N can be one half or one quarter of M. As an example N=16 blocks can be refreshed at a time in step 1002e while M=32 or 64 blocks are refreshed at a time in step 1005.

Figure 10B:
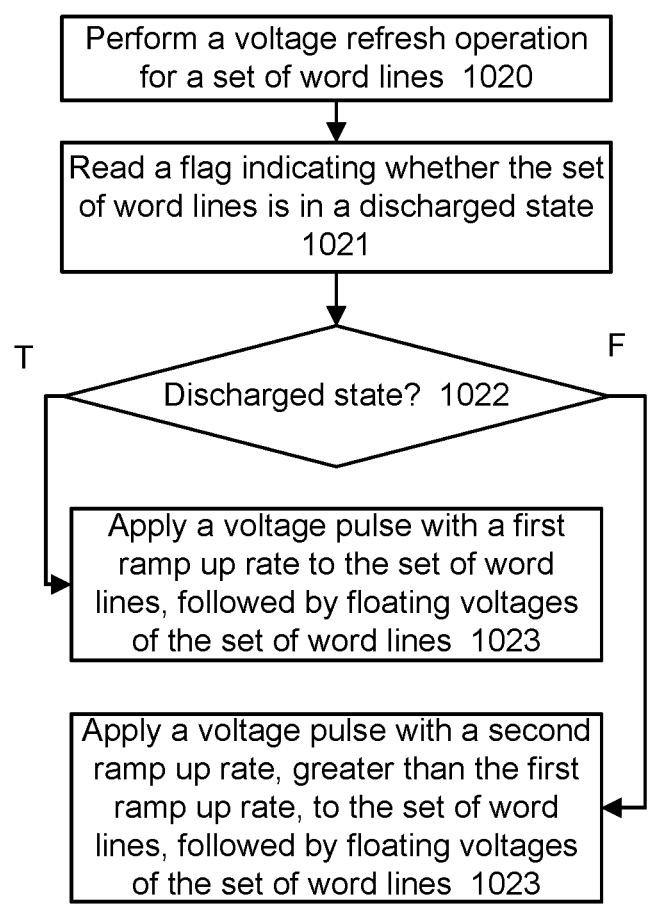
FIG. 10B depicts a flowchart of an example process for performing a word line voltage refresh operation for a block with a power-saving technique when a flag indicates the block is in the first read state.

FIG. 10B depicts a flowchart of an example process for performing a word line voltage refresh operation for a block with a power-saving technique when a flag indicates the block is in the first read state. In the process of FIG. 10A, an assumption is made that a set of word lines is in a first read state at the time of a power up. However, there may be other situations where it known, or is likely, that a set of word lines is in a first read state. For example, an operation such as a test of the word line drivers can involve grounding the word lines. In such situations, a control circuit can set a flag or other data to identify a block which is in the first read state. The flag can be maintained by the control circuitry 110 of FIG. 1A, for example, or stored in the memory cells of the block itself.

Step 1020 includes performing a voltage refresh operation for the set of word lines. Step 1021 includes, in connection with the performing the voltage refresh operation, reading a flag indicating whether the set of word lines is in a discharged state, e.g., the first read state. A decision step 1022 determines whether the flag indicates the set of word lines is in the discharged state. If the decision step is true, step 1023 includes applying a voltage pulse with a first ramp up rate to the set of word lines, followed by floating voltages of the set of word lines. If the decision step is false, step 1023 includes applying a voltage pulse with a second ramp up rate, greater than the first ramp up rate, to the set of word lines, followed by floating voltages of the set of word lines.

Furthermore, when the flag indicates the set of word lines is in the discharged state, the performing the voltage refresh operation comprises allocating a time period for the voltage pulse with the first ramp up rate which is greater than a time period allocated for the voltage pulse with the second ramp up rate.

The flag can indicate the set of word lines is in the discharged state when the set of word lines are grounded.

The flag can indicate the set of word lines is in the discharged state when the control circuit is powered up from a powered down state.

The flag can indicate the set of word lines is in the discharged state when a time period since a last voltage refresh operation for the set of word lines exceeds a threshold, such as RTP in FIGS. 11A and 11B. With this passage of time, the word lines discharge to the first read state.

In FIGS. 11A and 11B, the vertical axis denotes word line voltage and the horizontal axis denotes time. Rf denotes a word line voltage refresh operation and Rd denotes a read operation.

FIG. 11A depicts an example plot of word line voltage versus time, consistent with the process of FIG. 10A, step 1004. Initially, from t0-t1, the memory device is in a powered down state so that no voltage is applied to the word line and the word line voltages can discharge to 0 V. The memory device powers up at t1, at which time a word line voltage refresh operation is performed by applying a voltage pulse 1101 to a set of word lines. This is the initial post-power up refresh operation which uses a power-saving technique. VWL is ramped down at t2 and then floated, as denoted by the dashed line from t2-t3. VWL initially floats higher and then gradually discharges. A refresh time period, RTP, can be set to periodically repeat the refresh operation to limit the amount of discharge.

An additional refresh operation, without the power-saving technique, occurs at t3-t4 by applying the voltage pulse 1102. Subsequently, before the RTP passes again, a read operation is requested and performed at t5-t6, as represented by the voltage pulse 1103. The duration of the voltages pulse for the refresh and read operations can be the same or different. When the RTP passes, an additional refresh operation, without the power-saving technique, is performed at t7-t8 as represented by the voltage pulse 1104. Similarly, when the RTP passes again, an additional refresh operation, without the power-saving technique, is performed at t9-t10 as represented by the voltage pulse 1105.

FIG. 11B depicts an example plot of word line voltage versus time, consistent with the process of FIG. 10A, steps 1002 and 1004. Initially, from t0-t1, the memory device is in a powered down state. The memory device powers up at t1, at which time read operations are performed at t1-t2 and t2-t3 for two example pages of data by applying voltage pulses 1111 and 1112, respectively, to the unselected word lines in the selected block in which the read occurs. See FIG. 14A for examples of voltages applied to a selected word line in a read operation. The read operation associated with the voltage pulse 1111 is an initial post-power up read operation which may use a power-saving technique, while the read operations associated with the voltage pulses 1112 and 1116 are additional read operations which may omit the power-saving technique, if performed on the same block associated with the voltage pulse 1111. If the read operations associated with the voltage pulses 1112 and 1116 are performed on different blocks than the block associated with the voltage pulse 1111, a power-saving technique can be used, in one approach. In another approach, a power-saving technique is not used on a block if it is known that a refresh operation has already been performed on the block after the power up.

In this example, an initial post-power up refresh operation is performed at t3-t4, as represented by the voltage pulse 1113, using a power-saving technique. This refresh operation is performed immediately after VWL is ramped down at t3. At the end of this power-saving refresh operation, VWL initially floats higher and then gradually discharges, and the RTP can be set to periodically repeat the refresh operation.

After the RTP passes, a refresh operation occurs at t5-t6 by applying the voltage pulse 1114. The power-saving technique can be omitted for this refresh operation since the word lines of each block are in the second read state at the time of the refresh due to the earlier power-saving refresh operation at t3-t4.

In this example, an additional read operation is performed at t9-t10 by applying a voltage pulse 1116 to the unselected word lines. The power-saving technique used for the voltage pulse 1111 can be omitted since the word lines are in the second read state at the start of this additional read operation.

A corresponding method can include: powering up a control circuit from a powered down state, where the control circuit is configured to connect to a set of word lines, the word lines are connected to memory cells; after the powering up, performing an initial post-power up read operation (at t1-t2), the performing the initial post-power up read operation comprises applying a read pass voltage with a first ramp up rate to unselected word lines of the set of word lines and applying a read voltage to a selected word line of the set of word lines; and after the performing of the initial post-power up read operation, perform an additional read operation (at t9-t10), the performing the additional read operation comprises applying the read pass voltage with a second ramp up rate which is greater than the first ramp up rate to unselected word line of the set of word lines and applying a read voltage to a selected word line of the set of word lines.

The method can further include performing a voltage refresh operation (at t5-t6 or t7-t8) for the set of word lines between the initial post-power up read operation and the additional read operation.

Furthermore, voltages of the set of word lines can be greater at a start of the additional read operation than at a start of the initial post-power up read operation, e.g., compare Vf to 0 V in FIG. 14A.

The initial post-power up read operation can have a higher priority than a voltage refresh operation for the set of word lines.

FIG. 12 depicts an example of the block program status table 117 of FIG. 1A for use with the process of FIG. 10A, step 1002e. The table or other data structure can be used to identify a programmed or erased status of a block. As mentioned, the block program status table 117 or other data structure can store data indicating whether a block is programmed, e.g., comprises programmed memory cells of one or more word lines, or erased, e.g., does not comprise programmed memory cells. An erased block can be excluded from a word line voltage refresh operation to reduce peak Icc as a power saving technique. In this example, eight blocks, BLK0-BLK7, consistent with FIG. 4, are listed with a program status of 1, for programmed, or 0 for erased. BLK0 is the sole programmed block in this example.

Based on this information, a word line voltage refresh operation can be performed for BLK0 but not for BLK1-BLK7. In another option, the word line voltage refresh operation is performed for each block in a group of blocks, such as GRP0 and GRP1 in FIG. 3E, if one or more blocks in the group are programmed. In this case, since BLK0 is in GRP0, the word line voltage refresh operation would be performed for BLK0-BLK3 but not BLK4-BLK7. A program status could be provided for a group of blocks.

Omitting the refresh operation for erased blocks can be combined with one or more other power saving techniques, in one approach.

The table can be part of the circuitry 110 of FIG. 1A, in one approach. In another approach, the programmed or erased status of a block is stored in the memory cells of the block itself.

FIG. 13 depicts an example plot of ramp up rate versus temperature (T) for use with the process of FIG. 10A, step 1002f. Peak Icc tends to be higher when the temperature of the memory device is higher, e.g., due to an increase in thermal energy and leakage currents. Accordingly, the avoid an excessive peak Icc, the ramp up rate for the word line voltages in a read operation or a word line voltage refresh operation can be set as a decreasing function of temperature as a power saving technique. An indication of temperature can be provided by the temperature-sensing circuit 116 of FIG. 1A. That is, the ramp up rate can be lower when the temperature is higher. In this example, the ramp up rate is R1 when the temperature (T) is below a threshold, T_th, and R2<R1 when T is at or above T_th. The reduced ramp up rate can be combined with one or more other power saving techniques, in one approach.

FIG. 14A depicts example waveforms in a read operation consistent with the process of FIG. 10A, steps 1002 and 1003. The vertical direction denotes word line voltage and the horizontal direction denotes time, with time points t1-t12.

VWsel represents the voltage of a selected word line in a read operation. In the second read state, VWsel is initially floating at Vf (plot 1400), then is driven to 0 V just before t0 (plot 1401), and maintained at 0 V from t0-t5 (plot 1402). Or, in the first read state, VWsel is initially at 0 V (plot 1400a).

VWsel is then set to a first read level, VrA (plot 1403), at t5-t6 and to a second read level, VrE (plot 1404), at t6-7. These read levels can be used in an example of reading a lower page of data, as mentioned in connection with FIG. 8C. VWsel may then return to 0 V (plot 1405) before floating at t10 as depicted by the dashed line plots 1406 and 1407. VWsel initially floats higher from t10-t11 and then gradually discharges at t11-t12.

VWunsel2 represents the voltage of unselected word lines in a selected block in read operation, when the word lines are initially in the second read state. The voltage is initially at a floating level, Vf>0 V (plot 1410a). At t3-t4, the voltage is driven higher as depicted by a plot 1410b, to Vread in a time period Δt2 and maintained at Vread until t9 as depicted by a plot 1411. The voltage is then driven from Vread to a lower level such as 0 V at t9-t10 (plot 1412), resulting in a down coupling of the channel voltage, Vch (plot 1451). The voltage is then floated at t10-t12 as depicted by the plots 1413 and 1414 so that it us up coupled as Vch recovers (plot 1452).

VWunsel1 represents the voltage of unselected word lines in a selected block in a read operation, when the word lines are initially in the first read state. The voltage is initially at a low level such as 0 V, as depicted by a plot 1420, representing the first read state. Three options to increase the voltage to Vread are depicted. In a first option, depicted by a plot 1421, the voltage is increased or ramped up at a continuous rate from t0-t4. In a second option, depicted by a plot 1422, the voltage is increased using a staircase or stepped waveform from t0-t4. The time period for the increase is Δt1. Note that the initiating of the refresh voltage pulse with the plot 1421 occurs at t0, which is sooner than the initiating of the refresh voltage pulse with the plot 1410b at t3.

In a third option, depicted by a plot 1423, the voltage is ramped up at a continuous rate from t2-t5. The time period for the increase can be the same as for the first and second options, except the start or initiating of the ramp up is later than with the first and second options.

The third option could be used as part of step 1002c of FIG. 10A, where the ramp up is initiated at different times for different groups of word lines in a block. For example, the ramp up can be initiated at t0 for one group of word lines and at t2 for another group of word lines. This power-saving technique can be extended to include more than two different ramp up times.

The third option could also be used as part of step 1002d of FIG. 10A, where the ramp up is initiated at different times for different blocks of word lines. For example, the ramp up can be initiated at t0 for one block of word lines and at t2 for another block of word lines. This power-saving technique can be extended to include more than two different ramp up times.

Once the voltage is ramped up to Vread, represented by a plot 1424, it is maintained at that level until t9. The voltage is ramped down at t9-t10 (plot 1425), resulting in down coupling of Vch. The voltage then floats at t10-t12 (plots 1426 and 1427).

A voltage pulse represented by the plots 1421, 1424 and 1425 is an example of a first voltage pulse which is applied to a set of word lines in a priority post-power up read operation consistent with step 1002 of FIG. 10A. The voltage pulse has a reduced ramp up rate from the first read state compared to the rate of the plot 1410*b* which shows a ramp up from the second read state. After applying the first voltage pulse, the voltages of the word lines are floated. A voltage pulse represented by the plots 1423, 1424 and 1425 is another example of a first voltage pulse. A voltage pulse represented by the plots 1410*b*, 1411 and 1412 is an example of a second voltage pulse which is applied to a set of word lines in a read operation consistent with step 1003 of FIG. 10A.

To implement a power-saving technique, a control circuit can be configured to set a ramp up rate of the first voltage pulse (e.g., Vread/Δt1) to be less than a ramp up rate of the second voltage pulse (e.g., (Vread−Vf)/Δt2) and to allocate a time period Δt1 for the first voltage pulse to be greater than an allocated time period Δt2 for the second voltage pulse. Further, to implement a power-saving technique, a control circuit can be configured to set a peak magnitude of the first voltage pulse (e.g., Vread−Δ) to be less than a peak magnitude of the second voltage pulse (e.g., Vread).

Vsg represents a voltage of a select gate such as the SGD and SGS transistors. The voltage is increased to a peak level, e.g., 6 V, at t2-t4 (plot 1430), to provide the select gate transistors in a conductive state. The voltage is maintained at the peak level until t7 (plot 1431), then decreased to 0 V at t7-8 (plot 1432). When Vsg decreases below a cutoff voltage, Vcutoff, between t7 and t8, the select gate transistors become non-conductive so that the channel voltage floats. The cutoff of the select gate transistors before the decrease of the unselected word line voltage at t9-t10 allows the channel voltage to be down coupled, as discussed. In another option, the select gate transistors are not cutoff before the decrease of the unselected word line voltage. In this case, the channel voltage begins to float when the unselected word line voltages fall below the Vth of the memory cells, cutting off the respective channel regions.

Vbl represents the voltages of the bit lines connected to the NAND strings. Vbl can be set at a small positive level such as 0.5 V (plot 1440) during the read operation.

Vch represents the voltage of the channels of the NAND strings involved in the refresh or read operation. Vch can be set at a level based on Vbl, in one approach at t2-t9 (plot 1450). Vch is down coupled at t9-t10 (plot 1451), then recovers to about 0 V at t10-t11 and is maintained at the recovery level from t11-t12 (plot 1453).

FIG. 14B depicts example waveforms in a word line voltage refresh operation consistent with the process of FIG. 10A, steps 1004 and 1005. VWL2 represents the voltage of each word line in a set of word lines involved in a refresh operation, when the word lines are initially in the second read state. The voltage is initially at a floating level, Vf>0 V (plot 1410*a*). At t3-t4, the voltage is driven higher as depicted by a plot 1410*br*, to Vrefresh in a time period Δt2 and maintained at Vrefresh until t9 as depicted by a plot 1411*r*. Vrefresh may be lower than Vread, in one approach. The voltage is then driven from Vrefresh to a lower level such as 0 V at t9-t10 (plot 1412*r*), resulting in a down coupling of the channel voltage, Vch (plot 1451). The voltage is then floated at t10-t12 as depicted by the plots 1413 and 1414 so that it us up coupled as Vch recovers (plot 1452).

VWL1 represents the voltage of each word line in a set of word lines involved in a refresh operation, when the word lines are initially in the first read state. The voltage is initially at a low level such as 0 V, as depicted by a plot 1420, representing the first read state. Three options to increase the voltage to Vread are depicted. In a first option, depicted by a plot 1421*r*, the voltage is increased or ramped up at a continuous rate from t0-t4. In a second option, depicted by a plot 1422*r*, the voltage is increased using a staircase or stepped waveform from t0-t4. The time period for the increase is Δt1. Note that the initiating of the refresh voltage pulse with the plot 1421*r* occurs at t0, which is sooner than the initiating of the refresh voltage pulse with the plot 1410*br* at t3.

In a third option, depicted by a plot 1423*r*, the voltage is ramped up at a continuous rate from t2-t5. The time period for the increase can be the same as for the first and second options, except the start or initiating of the ramp up is later than with the first and second options.

The third option could be used as part of step 1002*c* of FIG. 10A, where the ramp up is initiated at different times for different groups of word lines in a block. For example, the ramp up can be initiated at t0 for one group of word lines and at t2 for another group of word lines. This power-saving technique can be extended to include more than two different ramp up times.

The third option could also be used as part of step 1002*d* of FIG. 10A, where the ramp up is initiated at different times for different blocks of word lines. For example, the ramp up can be initiated at t0 for one block of word lines and at t2 for another block of word lines. This power-saving technique can be extended to include more than two different ramp up times.

Once the voltage is ramped up to Vrefresh, represented by a plot 1424*r*, it is maintained at that level until t9. The voltage is ramped down at t9-t10 (plot 1425*r*), resulting in down coupling of Vch. The voltage then floats at t10-t12 (plots 1426 and 1427).

A voltage pulse represented by the plots 1421*r*, 1424*r* and 1425*r* is an example of a first voltage pulse which is applied to a set of word lines in an initial post-power up refresh of voltages of the set of word lines consistent with step 1004 of FIG. 10A. The voltage pulse has a reduced ramp up rate from the first read state compared to the rate of the plot 1410*br* which shows a ramp up from the second read state. After applying the first voltage pulse, the voltages of the word lines are floated. A voltage pulse represented by the plots 1423*r*, 1424*r* and 1425*r* is another example of a first voltage pulse. A voltage pulse represented by the plots 1410*br*, 1411*r* and 1412*r* is an example of a second voltage pulse which is applied to a set of word lines in an additional refresh operation consistent with step 1005 of FIG. 10A.

To implement a power-saving technique, a control circuit can be configured to set a ramp up rate of the first voltage pulse (e.g., Vrefresh/Δt1) to be less than a ramp up rate of the second voltage pulse (e.g., (Vrefreshv−Vf)/Δt2) and to allocate a time period Δt1 for the first voltage pulse to be greater than an allocated time period Δt2 for the second voltage pulse. Further, to implement a power-saving technique, a control circuit can be configured to set a peak magnitude of the first voltage pulse (e.g., Vrefresh-A) to be less than a peak magnitude of the second voltage pulse (e.g., Vrefresh).

Vsg, Vbl and Vch are as depicted in FIG. 14A.

Figure 15:
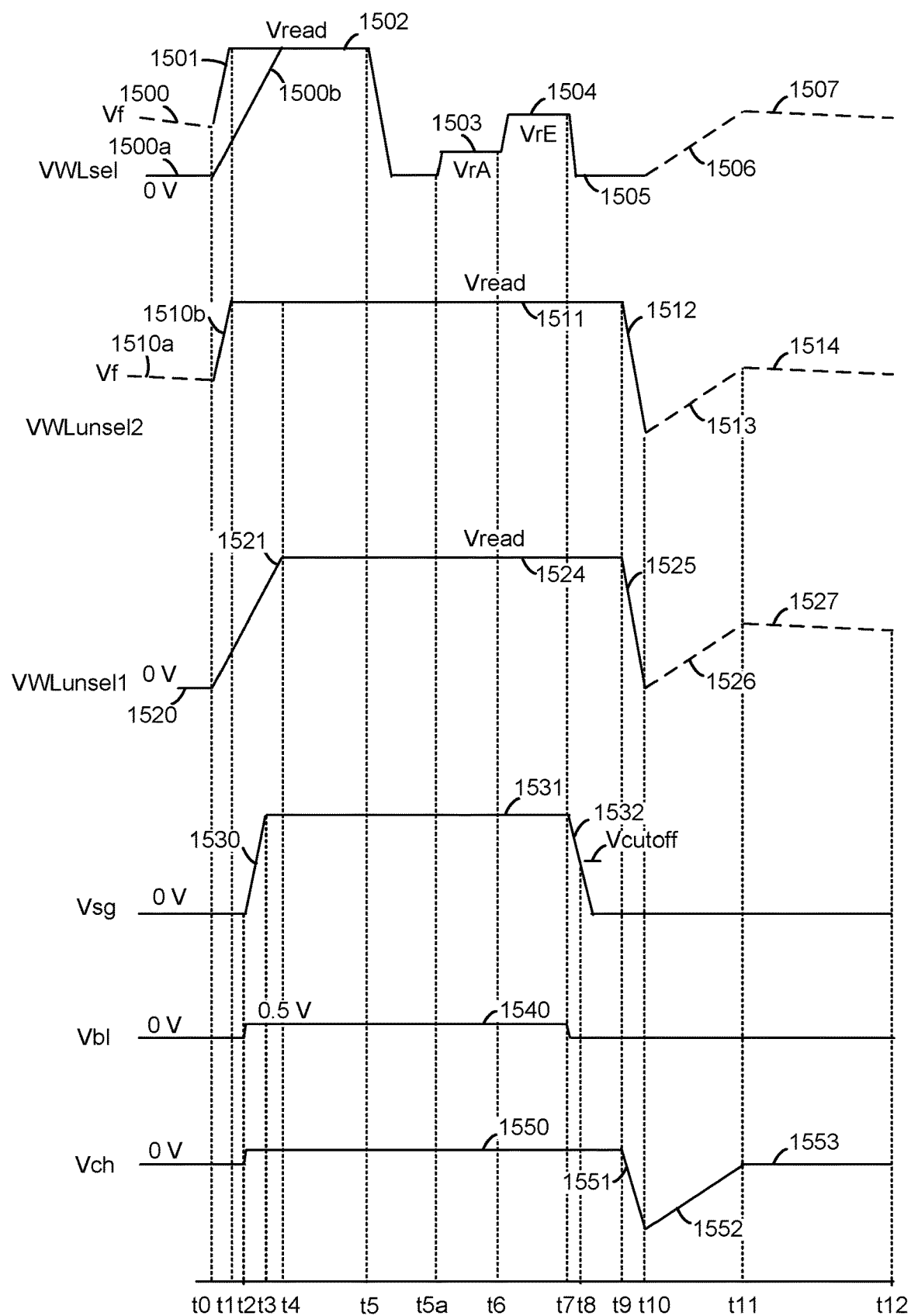
FIG. 15 depicts example waveforms in another example read operation consistent with the process of FIG. 10A, steps 1002 and 1003.

FIG. 15 depicts example waveforms in another example read operation consistent with the process of FIG. 10A, steps 1002 and 1003. This example differs from FIG. 14A in that VWsel has a pre-read voltage spike before the sending occurs. The voltage spike ramps up to Vread at the same time as the voltage on the unselected word lines at t0, and is maintained at Vread until t5, when it ramps back down to 0 V. This spike helps ensure the NAND string channel is conductive to even out the channel potential.

In the second read state, VWsel is initially floating at Vf (plot 1500), then is driven to Vrefresh at t0-t1 (plot 1501), and maintained at Vread from t1-t5 (plot 1502). Or, in the first read state, VWsel is initially at 0 V (plot 1500a).

VWsel is then set to a first read level, VrA (plot 1503), at t5a-t6 and to a second read level, VrE (plot 1504), at t6-t7. VWsel may then return to 0 V (plot 1505) before floating at t10 as depicted by the dashed line plots 1506 and 1507. VWsel initially floats higher from t10-t11 and then gradually discharges at t11-t12.

VWunsel2 represents the voltage of unselected word lines in a selected block in read operation, when the word lines are initially in the second read state. The voltage is initially at a floating level, Vf>0 V (plot 1510a). At t0-t1, the voltage is driven higher as depicted by a plot 1510b, to Vread and maintained at Vread until t9 as depicted by a plot 1511. The voltage is then driven from Vread to a lower level such as 0 V at t9-t10 (plot 1512), resulting in a down coupling of the channel voltage, Vch (plot 1551). The voltage is then floated at t10-t12 as depicted by the plots 1513 and 1514 so that it us up coupled as Vch recovers (plot 1552).

VWunsel1 represents the voltage of unselected word lines in a selected block in a read operation, when the word lines are initially in the first read state. The voltage is initially at a low level such as 0 V, as depicted by a plot 1520, representing the first read state. A first option to increase the voltage to Vread is depicted by a plot 1521, where the voltage is increased or ramped up at a continuous rate from t0-t4. The second and third options are as discussed in connection with FIG. 14A.

Once the voltage is ramped up to Vread, represented by a plot 1524, it is maintained at that level until t9. The voltage is ramped down at t9-t10 (plot 1525), resulting in down coupling of Vch. The voltage then floats at t10-t12 (plots 1526 and 1527).

A voltage pulse represented by the plots 1521, 1524 and 1525 is an example of a first voltage pulse which is applied to a set of word lines in a priority post-power up read operation consistent with step 1002 of FIG. 10A. The voltage pulse has a reduced ramp up rate from the first read state compared to the rate of the plot 1510b which shows a ramp up from the second read state. After applying the first voltage pulse, the voltages of the word lines are floated. A voltage pulse represented by the plots 1510b, 1511 and 1512 is an example of a second voltage pulse which is applied to a set of word lines in a read operation consistent with step 1003 of FIG. 10A.

To implement a power-saving technique, a control circuit can be configured to set a ramp up rate of the first voltage pulse (e.g., Vread/$\Delta$t1) to be less than a ramp up rate of the second voltage pulse (e.g., (Vread−Vf)/$\Delta$t2) and to allocate a time period $\Delta$t1 for the first voltage pulse to be greater than an allocated time period $\Delta$t2 for the second voltage pulse. Further, to implement a power-saving technique, a control circuit can be configured to set a peak magnitude of the first voltage pulse (e.g., Vread−$\Delta$) to be less than a peak magnitude of the second voltage pulse (e.g., Vread).

Vsg, Vbl and Vch are similar to what is depicted in FIG. 14A.

Vsg is increased to a peak level, e.g., 6 V, at t2-t4 (plot 1530), to provide the select gate transistors in a conductive state. The voltage is maintained at the peak level until t7 (plot 1531), then decreased to 0 V at t7-t8 (plot 1532). When Vsg decreases below a cutoff voltage, Vcutoff, between t7 and t8, the select gate transistors become non-conductive so that the channel voltage floats.

Vbl can be set at a small positive level such as 0.5 V (plot 1540) during the read operation.

Vch can be set at a level based on Vbl, in one approach at t2-t9 (plot 1550). Vch is down coupled at t9-t10 (plot 1551), then recovers to about 0 V at t10-t11 and is maintained at the recovery level from t11-t12 (plot 1553).

Accordingly, it can be seen that in one implementation, an apparatus comprises: a control circuit configured to connect to a set of word lines, the word lines are connected to memory cells in one or more blocks. The control circuit is configured to: power up from a powered down state; after the powering up, perform an initial post-power up refresh of voltages of the set of word lines, wherein to perform the initial post-power up refresh, the control circuit is configured to apply a first voltage pulse to the set of word lines followed by floating voltages of the set of word lines; after the performing of the initial post-power up refresh, perform an additional refresh of voltages of the set of word lines, wherein to perform the additional refresh, the control circuit is configured to apply a second voltage pulse to the set of word lines followed by floating voltages of the set of word lines; and implement a power-saving technique in the initial post-power up refresh, the power-saving technique is not implemented in the additional refresh.

In another implementation, a method comprises: powering up a control circuit from a powered down state, the control circuit is configured to connect to a set of word lines, the word lines are connected to memory cells; after the powering up, performing an initial post-power up read operation, the performing the initial post-power up read operation comprises applying a read pass voltage with a first ramp up rate to unselected word lines of the set of word lines and applying a read voltage to a selected word line of the set of word lines; and after the performing of the initial post-power up read operation, perform an additional read operation, the performing the additional read operation comprises applying the read pass voltage with a second ramp up rate which is greater than the first ramp up rate to unselected word line of the set of word lines and applying a read voltage to a selected word line of the set of word lines.

In another implementation, an apparatus comprises: a control circuit configured to connect to a set of word lines, the word lines are connected to memory cells in a block; and an interface connected to the control circuit. The control circuit is configured to issue a command via the interface to: perform a voltage refresh operation for the set of word lines; in connection with the performing the voltage refresh operation, read a flag indicating whether the set of word lines is in a discharged state; when the flag indicates the set of word lines is in the discharged state, the performing the voltage refresh operation comprises applying a voltage pulse with a first ramp up rate to the set of word lines followed by floating voltages of the set of word lines; and when the flag does not indicate the set of word lines is in the discharged state, the performing the voltage refresh operation comprises applying a voltage pulse with a second ramp up rate, greater than the first ramp up rate, to the set of word lines followed by floating voltages of the set of word lines.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

I claim:

1. An apparatus, comprising:
a control circuit configured to connect to a set of word lines, the word lines are connected to memory cells in one or more blocks, the control circuit is configured to:
power up from a powered down state;
after the powering up, perform an initial post-power up refresh of voltages of the set of word lines, wherein to perform the initial post-power up refresh, the control circuit is configured to apply a first voltage pulse to the set of word lines followed by floating voltages of the set of word lines;
after the performing of the initial post-power up refresh, perform an additional refresh of voltages of the set of word lines, wherein to perform the additional refresh, the control circuit is configured to apply a second voltage pulse to the set of word lines followed by floating voltages of the set of word lines; and
implement a power-saving technique in the initial post-power up refresh, the power-saving technique is not implemented in the additional refresh.

2. The apparatus of claim 1, wherein:
to implement the power-saving technique, the control circuit is configured to set a ramp up rate of the first voltage pulse to be less than a ramp up rate of the second voltage pulse.

3. The apparatus of claim 2, wherein:
the control circuit is configured to allocate a time period for the first voltage pulse to be greater than an allocated time period for the second voltage pulse.

4. The apparatus of claim 2, wherein:
the ramp up rate of the first voltage pulse is a decreasing function of temperature.

5. The apparatus of claim 1, wherein:
the set of word lines are connected to memory cells in programmed blocks; and
to implement the power-saving technique, the control circuit is configured to determine that a number of the programmed blocks exceeds a threshold and set a ramp up rate of the first voltage pulse to be less than a ramp up rate of the second voltage pulse in response to the determining that the number of the programmed blocks exceeds the threshold.

6. The apparatus of claim 1, wherein:
to implement the power-saving technique, the control circuit is configured to attain a peak magnitude of the first voltage pulse in multiple steps.

7. The apparatus of claim 1, wherein:
the set of word lines are connected to the memory cells in a plurality of blocks;
to implement the power-saving technique, the control circuit is configured to apply the first voltage pulse to word lines of N blocks at a time; and
the control circuit is configured to apply the second voltage pulse to word lines of M>N blocks at a time, where M and N are positive integers.

8. The apparatus of claim 1, wherein:
the set of word lines are connected to the memory cells in a plurality of blocks;
to implement the power-saving technique, the control circuit is configured to initiate a ramp up of the first voltage pulse to word lines of N blocks at a time; and
the control circuit is configured to initiate a ramp up of the second voltage pulse to word lines of M>N blocks at a time, where M and N are positive integers.

9. The apparatus of claim 1, wherein:
to implement the power-saving technique, the control circuit is configured to initiate a ramp up of the first voltage pulse for different word lines of the set of word lines at different time; and
the control circuit is configured to initiate a ramp up of the second voltage pulse concurrently for each word line of the set of word lines.

10. The apparatus of claim 1, wherein:
the powered down state is an off state.

11. The apparatus of claim 1, wherein:
the powered down state is a sleep state.

12. A method, comprising:
powering up a control circuit from a powered down state, the control circuit is configured to connect to a set of word lines, the word lines are connected to memory cells;
after the powering up, performing an initial post-power up read operation, the performing the initial post-power up read operation comprises applying a read pass voltage with a first ramp up rate to unselected word lines of the set of word lines and applying a read voltage to a selected word line of the set of word lines; and
after the performing of the initial post-power up read operation, perform an additional read operation, the performing the additional read operation comprises applying the read pass voltage with a second ramp up rate which is greater than the first ramp up rate to unselected word line of the set of word lines and applying a read voltage to a selected word line of the set of word lines.

13. The method of claim 12, further comprising:
performing a voltage refresh operation for the set of word lines between the initial post-power up read operation and the additional read operation.

14. The method of claim 13, wherein:
voltages of the set of word lines are greater at a start of the additional read operation than at a start of the initial post-power up read operation.

15. The method of claim 12, wherein:
the initial post-power up read operation has a higher priority than a voltage refresh operation for the set of word lines.

16. An apparatus, comprising:
a control circuit configured to connect to a set of word lines, the word lines are connected to memory cells in a block; and
an interface connected to the control circuit, the control circuit is configured to issue a command via the interface to:
perform a voltage refresh operation for the set of word lines;
in connection with the performing the voltage refresh operation, read a flag indicating whether the set of word lines is in a discharged state;

when the flag indicates the set of word lines is in the discharged state, the performing the voltage refresh operation comprises applying a voltage pulse with a first ramp up rate to the set of word lines followed by floating voltages of the set of word lines; and when the flag does not indicate the set of word lines is in the discharged state, the performing the voltage refresh operation comprises applying a voltage pulse with a second ramp up rate, greater than the first ramp up rate, to the set of word lines followed by floating voltages of the set of word lines.

17. The apparatus of claim 16, wherein:
when the flag indicates the set of word lines is in the discharged state, the performing the voltage refresh operation comprises allocating a time period for the voltage pulse with the first ramp up rate which is greater than a time period allocated for the voltage pulse with the second ramp up rate.

18. The apparatus of claim 16, wherein:
the flag indicates the set of word lines is in the discharged state when the set of word lines are grounded.

19. The apparatus of claim 16, wherein:
the flag indicates the set of word lines is in the discharged state when the control circuit is powered up from a powered down state.

20. The apparatus of claim 16, wherein:
the flag indicates the set of word lines is in the discharged state when a time period since a last voltage refresh operation for the set of word lines exceeds a threshold.

* * * * *